(12) United States Patent
Chan et al.

(10) Patent No.: US 11,131,511 B2
(45) Date of Patent: Sep. 28, 2021

(54) HEAT DISSIPATION PLATE AND METHOD FOR MANUFACTURING THE SAME

(71) Applicant: COOLER MASTER CO., LTD., New Taipei (TW)

(72) Inventors: Wei-Lung Chan, New Taipei (TW); Wen-Ti Cheng, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 140 days.

(21) Appl. No.: 16/422,586

(22) Filed: May 24, 2019

(65) Prior Publication Data

US 2019/0366418 A1 Dec. 5, 2019

Related U.S. Application Data

(60) Provisional application No. 62/824,540, filed on Mar. 27, 2019, provisional application No. 62/824,531, (Continued)

(51) Int. Cl.
*F28D 15/04* (2006.01)
*F28F 3/12* (2006.01)
*B21D 53/04* (2006.01)
*F28F 3/14* (2006.01)
*B23P 15/26* (2006.01)
(Continued)

(52) U.S. Cl.
CPC ............. *F28D 15/04* (2013.01); *B21D 53/04* (2013.01); *B23P 15/26* (2013.01); *F28F 3/12* (2013.01); *F28F 3/14* (2013.01); *B21D 39/031* (2013.01); *B23K 2101/14* (2018.08); *F28D 2015/0216* (2013.01); *F28F 2255/06* (2013.01); *F28F 2255/08* (2013.01); *F28F 2255/18* (2013.01);
(Continued)

(58) Field of Classification Search
CPC ... B21D 53/04; B23P 15/26; Y10T 29/49368; F28F 2275/06
See application file for complete search history.

(56) References Cited

U.S. PATENT DOCUMENTS 3,255,702 A 6/1966 Gehrm
3,746,081 A 7/1973 Corman et al.
(Continued)

FOREIGN PATENT DOCUMENTS

CN 100470776C C 3/2009
TW 577538 U 2/2004
(Continued)

OTHER PUBLICATIONS

Non-Final Office Action dated Nov. 5, 2020 in U.S. Appl. No. 16/422,562.
(Continued)

*Primary Examiner* — Jason L Vaughan
(74) *Attorney, Agent, or Firm* — McDermott Will & Emery LLP

(57) ABSTRACT

A method for manufacturing a heat dissipation device that includes stamping a composite plate including a welding material to form a first plate having a plurality of angled grooves, depositing powder in the plurality of angled grooves of the first plate, contacting the first plate to a second plate, and welding the first plate and the second plate together, and sintering powder to obtain a capillary structure.

3 Claims, 27 Drawing Sheets

Related U.S. Application Data filed on Mar. 27, 2019, provisional application No. 62/677,329, filed on May 29, 2018.

(51) Int. Cl.
*F28D 15/02* (2006.01)
*B23K 101/14* (2006.01)
*B21D 39/03* (2006.01)

(52) U.S. Cl.
CPC ..... *F28F 2275/06* (2013.01); *Y10T 29/49368* (2015.01)

(56) References Cited

U.S. PATENT DOCUMENTS

| | | | |
|---|---|---|---|
| 3,757,856 A * | 9/1973 | Kun | B21D 53/04 165/166 |
| 4,058,160 A | 11/1977 | Corman et al. | |
| 4,118,756 A | 10/1978 | Nelson et al. | |
| 4,148,204 A * | 4/1979 | Dotzer | C10M 7/00 29/527.2 |
| 4,770,238 A | 9/1988 | Owen | |
| 5,125,454 A * | 6/1992 | Creamer | F28F 9/001 165/149 |
| 5,176,205 A * | 1/1993 | Anthony | B23K 35/286 165/133 |
| 5,377,901 A * | 1/1995 | Rungta | B23K 1/19 228/183 |
| 5,465,782 A | 11/1995 | Sun et al. | |
| 6,302,192 B1 | 10/2001 | Dussinger et al. | |
| 6,382,309 B1 | 5/2002 | Kroliczek et al. | |
| 6,604,669 B1 * | 8/2003 | Syslak | B23K 1/0012 228/166 |
| 6,738,257 B1 | 5/2004 | Lai | |
| 6,745,825 B1 | 6/2004 | Nakamura et al. | |
| 6,796,373 B1 | 9/2004 | Li | |
| 6,938,680 B2 | 9/2005 | Garner et al. | |
| 7,275,588 B2 | 10/2007 | Hsu | |
| 7,278,469 B2 | 10/2007 | Sasaki et al. | |
| 7,337,941 B2 * | 3/2008 | Scott | B23K 35/0233 148/24 |
| 7,443,677 B1 | 10/2008 | Zhou et al. | |
| 7,845,394 B2 | 12/2010 | Chang et al. | |
| 8,341,968 B2 * | 1/2013 | Landers | F28F 3/046 62/98 |
| 8,780,559 B2 | 7/2014 | Weaver, Jr. et al. | |
| 8,811,014 B2 | 8/2014 | Chauhan et al. | |
| 8,919,426 B2 * | 12/2014 | Hardesty | F28D 15/0233 165/104.21 |
| 9,453,668 B2 * | 9/2016 | Higashiiue | F25B 41/00 |
| 9,897,392 B2 * | 2/2018 | Wang | F28D 15/04 |
| 10,048,015 B1 | 8/2018 | Lin | |
| 10,907,907 B2 * | 2/2021 | Wang | F28F 3/12 |
| 2003/0010477 A1 | 1/2003 | Khrustalev et al. | |
| 2004/0067414 A1 | 4/2004 | Wei et al. | |
| 2004/0118553 A1 | 6/2004 | Krassowski et al. | |
| 2005/0092465 A1 | 5/2005 | Lin et al. | |
| 2005/0173098 A1 | 8/2005 | Connors | |
| 2005/0178532 A1 | 8/2005 | Meng-Cheng et al. | |
| 2006/0162905 A1 | 7/2006 | Hsu | |
| 2007/0193723 A1 | 8/2007 | Hou et al. | |
| 2007/0240855 A1 | 10/2007 | Hou et al. | |
| 2007/0272399 A1 | 11/2007 | Nitta et al. | |
| 2008/0036076 A1 | 2/2008 | Ouyang | |
| 2008/0144319 A1 | 6/2008 | Chang et al. | |
| 2009/0025910 A1 | 1/2009 | Hoffman et al. | |
| 2009/0101308 A1 | 4/2009 | Hardesty | |
| 2010/0051239 A1 | 3/2010 | Lin et al. | |
| 2010/0326629 A1 | 12/2010 | Meyer, IV et al. | |
| 2011/0000649 A1 | 1/2011 | Joshi et al. | |
| 2011/0088877 A1 | 4/2011 | Oniki et al. | |
| 2011/0174464 A1 | 7/2011 | Liu et al. | |
| 2011/0220328 A1 | 9/2011 | Huang et al. | |
| 2012/0111541 A1 | 5/2012 | Yan et al. | |
| 2012/0305222 A1 | 12/2012 | Yang et al. | |
| 2013/0037242 A1 | 2/2013 | Chen et al. | |
| 2013/0092359 A1 * | 4/2013 | Von Eckermann | F28F 9/0251 165/165 |
| 2013/0340978 A1 | 12/2013 | Agostini et al. | |
| 2014/0182819 A1 | 7/2014 | Yang | |
| 2014/0311713 A1 | 10/2014 | Wu et al. | |
| 2015/0026981 A1 * | 1/2015 | Yang | F28F 3/044 29/890.039 |
| 2015/0083372 A1 | 3/2015 | Yang | |
| 2015/0101784 A1 | 4/2015 | Pai | |
| 2015/0144309 A1 * | 5/2015 | Nash | B23P 15/26 165/133 |
| 2016/0003555 A1 | 1/2016 | Sun et al. | |
| 2016/0348985 A1 | 12/2016 | Sun et al. | |
| 2017/0122672 A1 | 5/2017 | Lin | |
| 2017/0153066 A1 | 6/2017 | Lin et al. | |
| 2017/0176112 A1 | 6/2017 | Sarraf et al. | |
| 2017/0227298 A1 | 8/2017 | Sun et al. | |
| 2017/0241717 A1 | 8/2017 | Sun et al. | |
| 2017/0292793 A1 | 10/2017 | Sun et al. | |
| 2017/0312871 A1 | 11/2017 | Lin | |
| 2017/0343297 A1 | 11/2017 | Lan | |
| 2017/0350657 A1 | 12/2017 | Yeh et al. | |
| 2017/0356694 A1 | 12/2017 | Tan et al. | |
| 2018/0023416 A1 | 1/2018 | Riaz et al. | |
| 2018/0066896 A1 | 3/2018 | Lin | |
| 2018/0350718 A1 | 12/2018 | Lin | |
| 2018/0369971 A1 * | 12/2018 | Chiang | F28F 13/187 |
| 2019/0049190 A1 | 2/2019 | Liu et al. | |
| 2019/0195567 A1 | 6/2019 | Wang et al. | |

FOREIGN PATENT DOCUMENTS

| | | |
|---|---|---|
| TW | 092205365 | 2/2004 |
| TW | M517314 U | 2/2016 |
| WO | 2017195254 A1 | 11/2017 |

OTHER PUBLICATIONS

Chapter 5: Heat Pipe Manufacturing—Bahman Zohuri (Apr. 2016) (Year: 2016).

Non-Final Office Action dated Nov. 12, 2020 in U.S. Appl. No. 16/119,707.

Non-Final Office Action issued in corresponding U.S. Appl. No. 13/471,898, dated May 13, 2014.

Final Office Action issued in corresponding U.S. Appl. No. 13/471,898, dated Jul. 27, 2018.

Non-Final Office Action issued in corresponding U.S. Appl. No. 13/471,898, dated Feb. 7, 2019.

Notice of Allowance issued in corresponding U.S. Appl. No. 16/159,398, dated May 28, 2019.

* cited by examiner

HEAT DISSIPATION PLATE AND METHOD FOR MANUFACTURING THE SAME

CROSS-REFERENCE TO RELATED APPLICATIONS

This non-provisional application claims priority under 35 U.S.C. § 119 to U.S. Provisional Application No. 62/677,329 filed May 29, 2018, U.S. Provisional Application No. 62/824,531 filed Mar. 27, 2019, and U.S. Provisional Application No. 62/824,540 filed Mar. 27, 2019. The entire contents of the foregoing applications are hereby incorporated by reference.

TECHNICAL FIELD

Example embodiments relate to a heat dissipation device, more particularly a heat dissipation plate having a capillary structure and a method for manufacturing the same.

BACKGROUND

As technology progresses, performance of electronic components has increased, and as a result, a large amount of heat is released during operation. To dissipate the generated heat, heat dissipation devices, such as a heat dissipation plate, are used with the electronic components. The heat dissipation plate includes a circulation channel filled with coolant. When the heat dissipation plate is in thermal contact with a heat source, such as an electrical component, the coolant in the circulation channel absorbs heat generated by the electronic component to cool the electronic component.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, and examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Embodiments in the present disclosure are directed to a heat dissipation device that improves the circulation of cooling fluid (also referred to as a coolant) in the heat dissipation device. The heat dissipation device, according to the example embodiments, permits the cooling fluid to flow in a direction opposite the force of gravity when the heat dissipation device is not completely filled with cooling fluid. In prior art heat dissipating devices, when a heat source is in thermal contact with the heat dissipation device above the surface of the cooling fluid in the heat dissipation device, the coolant circulating in the fluid channel of the heat dissipation device does not flow towards the heat source due to the gravitational force. Thus, heat generated by the heat source cannot be effectively dissipated by the cooling fluid.

Figure 1:
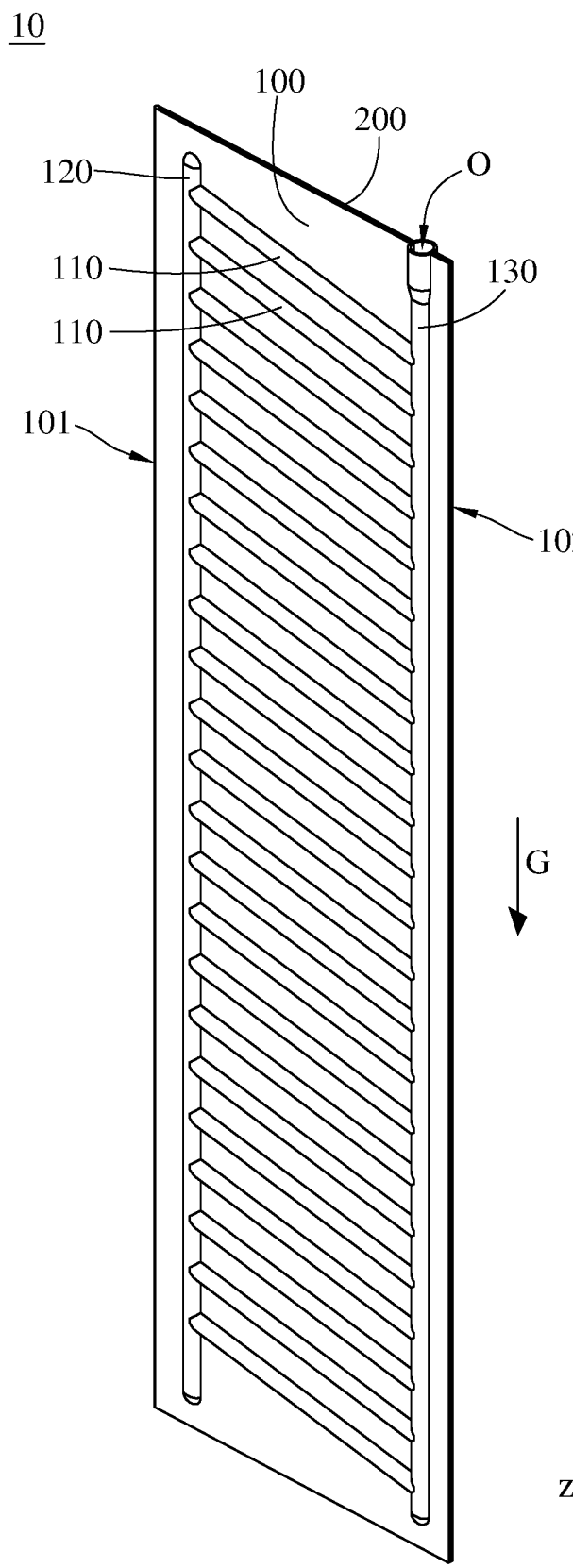
FIG. 1 is a perspective view of a heat dissipation plate according to an exemplary embodiment.
Figure 2:
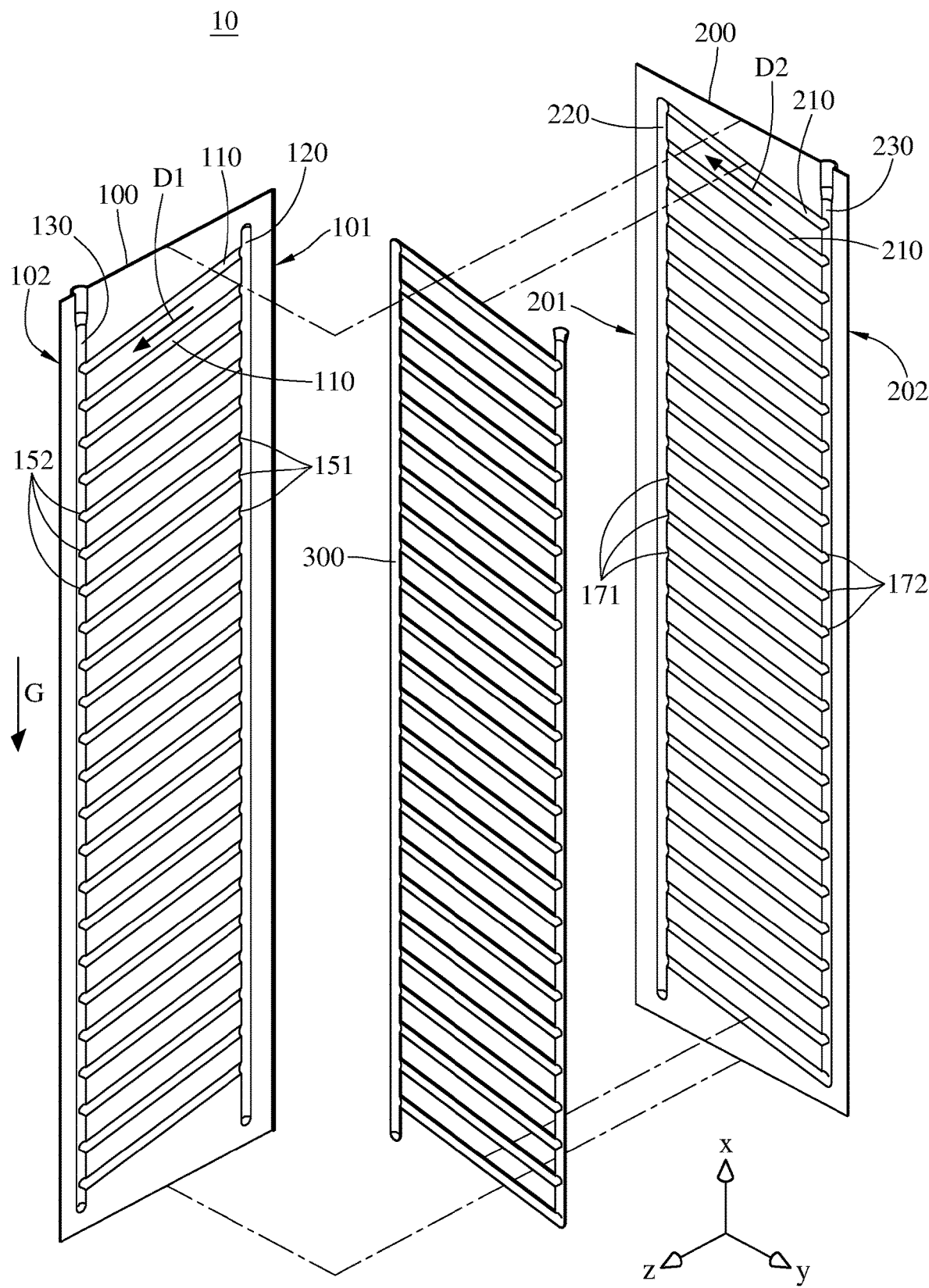
FIG. 2 is an exploded view of the heat dissipation plate in FIG. 1.
Figure 3:
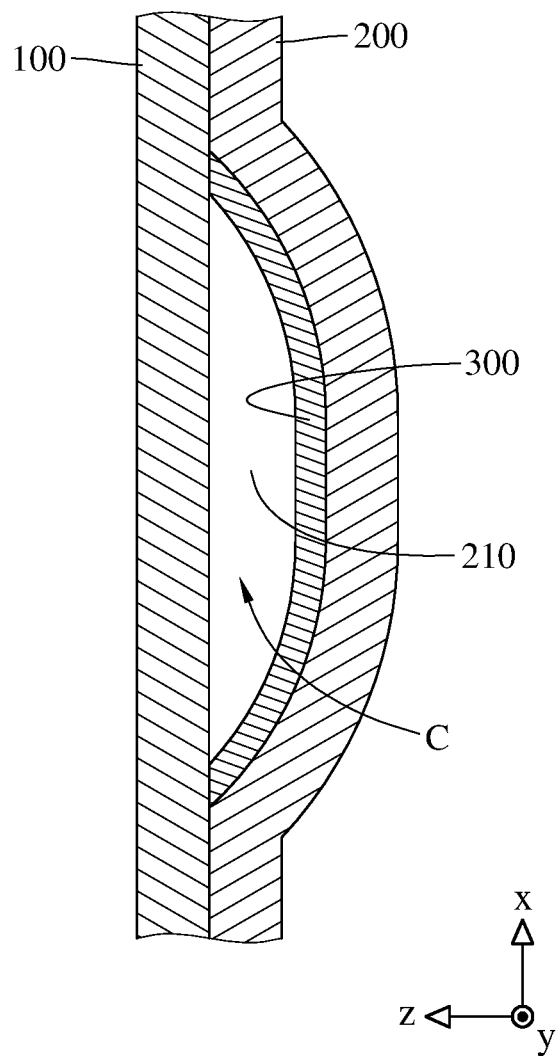
FIG. 3 is a partial cross-sectional view of the heat dissipation plate in FIG. 1.

FIG. 1 is a perspective view of a heat dissipation device 10 according to an exemplary embodiment. FIG. 2 is an exploded view of the heat dissipation device 10 in FIG. 1. FIG. 3 is a partial cross-sectional view of the heat dissipation device 10 in FIG. 1. In an example, and as illustrated, the heat dissipation device 10 in FIG. 1 is a plate-type device, referred to herein as a heat dissipation plate 10. It should be noted that embodiments as discussed herein are not applicable only to plate-type heat dissipation devices, but are equally applicable to heat dissipation devices of any shape, without departing from the spirit and scope of the disclosure.

As illustrated, the heat dissipation plate 10 includes a first plate 100, a second plate 200, and a capillary structure 300. The first plate 100 and the second plate 200 are disposed opposite each other and the capillary structure 300 is disposed between the first plate 100 and the second plate 200.

The first plate 100 has a first longitudinal edge (or side) 101 and a second longitudinal edge (or side) 102 opposite each other. The first plate 100 further has a first plurality of inclined or angled grooves 110 disposed in the longitudinal direction (or the X-direction in FIG. 1) and spaced apart from each other. Each groove 110 is a recess (or a concavity) that extends into the body of the first plate 100 and extends (in the Y-direction) between the first longitudinal edge 101 and the second longitudinal edge 102. Referring to FIG. 2, each groove 110 includes a first end 151 adjacent the first longitudinal edge 101 and a second end 152 adjacent the second longitudinal edge 102 and opposite the first end 151. As illustrated, the first end 151 is located higher than the second end 152, and, as a result, the grooves 110 are disposed at an angle in the first plate 100.

The first plate 100 also includes a first longitudinal groove 120 and a second longitudinal groove 130, both extending in the X-direction. The first longitudinal groove 120 is located adjacent the first longitudinal edge 101 and the second longitudinal groove 130 is located adjacent the second longitudinal edge 102. The first ends 151 of the grooves 110 are in fluid communication with the first longitudinal groove 120 and the second ends 152 of the grooves 110 are in fluid communication with the second longitudinal groove 130. Thus, the grooves 110 are in fluid communication with each other through the first and second longitudinal grooves 120 and 130. In FIG. 2, the first plate 100 is shown disposed vertically, and the direction indicated by the arrow G indicates the direction of the force of gravity.

The second plate 200 has a first longitudinal edge 201 and a second longitudinal edge 202 opposite each other. The second plate 200 also includes a second plurality of inclined or angled grooves 210 disposed in the longitudinal direction (or the X-direction in FIG. 1) and spaced apart from each other. Each groove 210 is a recess (or concavity) that extends into the body of the second plate 200 and extends (in the Y-direction) between the first longitudinal edge 201 and the second longitudinal edge 202. Referring to FIG. 2, each groove 210 includes a first end 171 adjacent the first longitudinal edge 201 and a second end 172 adjacent the second longitudinal edge 202 and opposite the first end 171. The first end 171 is located higher than the second end 172, and, as a result, the grooves 210 are disposed at an angle in the second plate 200.

The second plate 200 includes a first longitudinal groove 220 and a second longitudinal groove 230, both extending in the X-direction. The first longitudinal groove 220 is located adjacent the first longitudinal edge 201 and the second longitudinal groove 230 is located adjacent the second longitudinal edge 202. The first ends 171 of the grooves 210 are in fluid communication with the first longitudinal groove 220 and the second ends 172 of the grooves 210 are in fluid communication with the second longitudinal groove 230. Thus, the grooves 210 are in fluid communication with each other through the first and second longitudinal grooves 220 and 230.

As illustrated in FIG. 1, the second plate 200 is coupled to the first plate 100, such that the grooves 110 are parallel to the grooves 210 and misaligned with the grooves 210. In such an arrangement, grooves 110 and grooves 210 are offset from each other. In one embodiment, grooves 110 and grooves 210 partially overlap each other. In another embodiment, the groove 210 is located between two grooves 110. Further, in this arrangement, the first and second longitudinal grooves 120 and 130 of the first plate 100 are respectively aligned and fluidly connected to the first and second longitudinal grooves 220 and 230 of the second plate 200. As such, the grooves 110 and the grooves 210 are connected to each other via the first and second longitudinal grooves 120 and 130 of the first plate 100 and the first and second longitudinal grooves 220 and 230 of the second plate 200 to form a fluid channel C (FIG. 3) that allows coolant to flow therethrough. The fluid channel C is continuous throughout the heat dissipation plate 10, although, as discussed below, the entire fluid channel C may not be filled with coolant L.

Furthermore, the heat dissipation plate 10 includes an inlet O defined by the second longitudinal groove 130 of the first plate 100 and the second longitudinal groove 230 of the second plate 200. The inlet O permits coolant to be introduced into the fluid channel C. As illustrated, the inlet O is aligned with the second longitudinal groove 130 and the second longitudinal groove 230.

Figure 4:
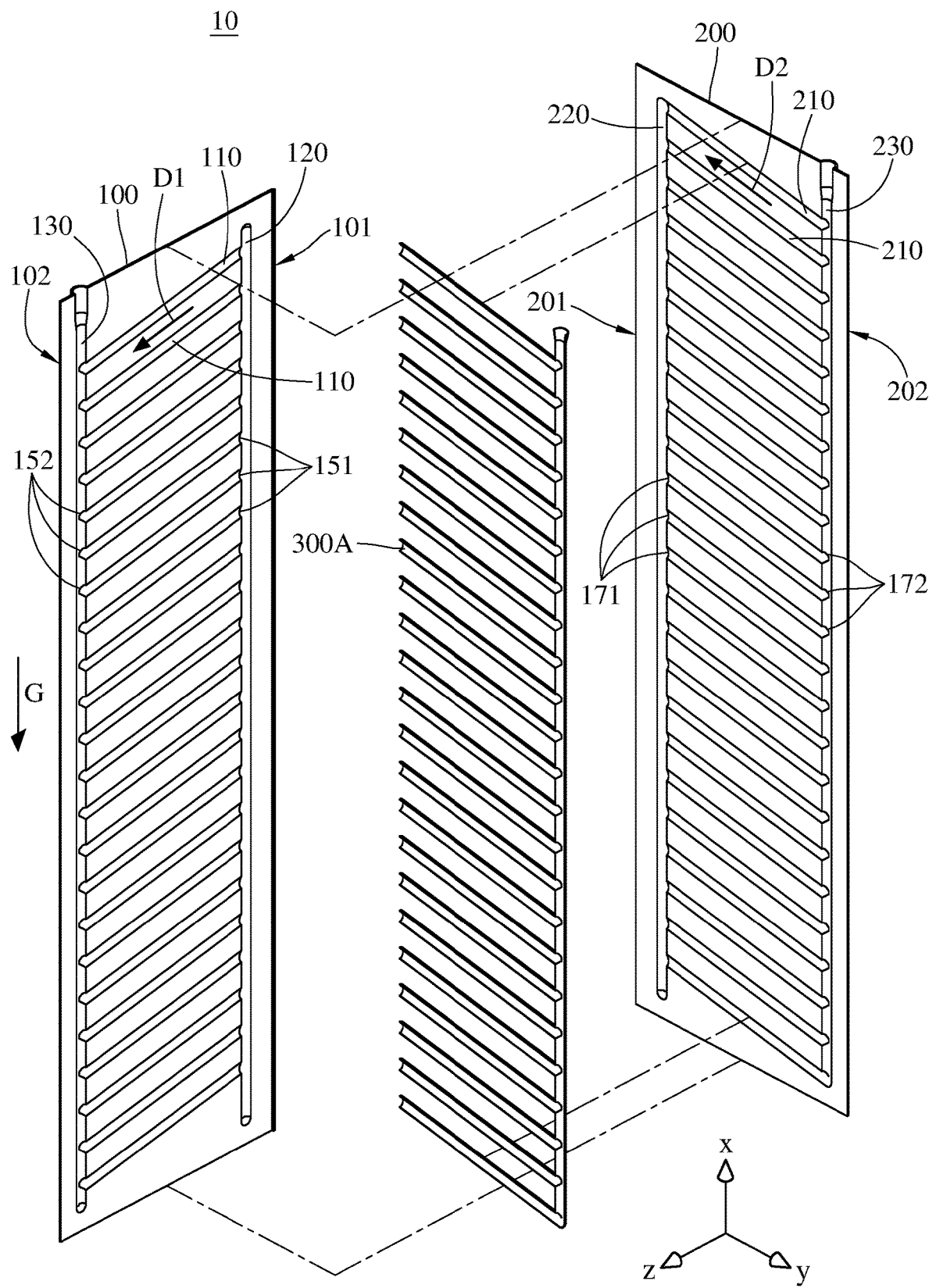
FIG. 4 is an exploded view of a heat dissipation plate according to an exemplary embodiment.

The capillary structure 300 is located in the fluid channel C. The coolant does not completely fill the fluid channel C and only part of the fluid channel C is occupied by the coolant. The capillary structure 300 extends from a position below a surface of the coolant to a position above the surface of the coolant. As such, the capillary structure 300 is partially immersed in the coolant. In one embodiment, the capillary structure 300 is located in the grooves 210 and both of the first and second longitudinal grooves 220 and 230 of the second plate 200. However, embodiments are not limited in this regard. In other embodiments, the capillary structure 300 may be located in the grooves 210 and only one of the first and second longitudinal grooves 220 and 230 of the second plate 200. For example, as shown in FIG. 4, a capillary structure 300A is located in the grooves 210 and the second longitudinal groove 230 of the second plate 200. The groove 110 may be referred to as a vapor channel and groove 210 may be referred to as the flow channel.

In some embodiments, the capillary structure 300 may not completely overlap the grooves 210 and the first and second longitudinal grooves 220 and 230 of the second plate 200. Stated otherwise, the capillary structure 300 may not completely line the grooves 210 and the first and second longitudinal grooves 220 and 230 of the second plate 200. In another embodiment, the capillary structure 300 may partially overlap or line the grooves 210 and the first and second longitudinal grooves 220 and 230 of the second plate 200. In yet another embodiment, if the first longitudinal groove 220 is adjacent a heat generating source, then the groove 210 and first longitudinal groove 220 above the surface S of the coolant L are completely lined with the capillary structure 300. The second longitudinal groove 230 does not include a capillary structure. Similarly, if the second longitudinal groove 230 is adjacent a heat generating source, then the groove 210 and second longitudinal groove 230 above the surface S of the coolant L are completely lined with the capillary structure 300. The first longitudinal groove 220 does not include a capillary structure.

FIG. 3 illustrates a partial cross-sectional view of the heat dissipation plate 10 including the capillary structure 300 in the fluid channel C defined by groove 210 of the second plate 200. As illustrated, the capillary structure 300 lines the groove 210, but does not completely fill (or occupy) the fluid channel C.

Figure 5:
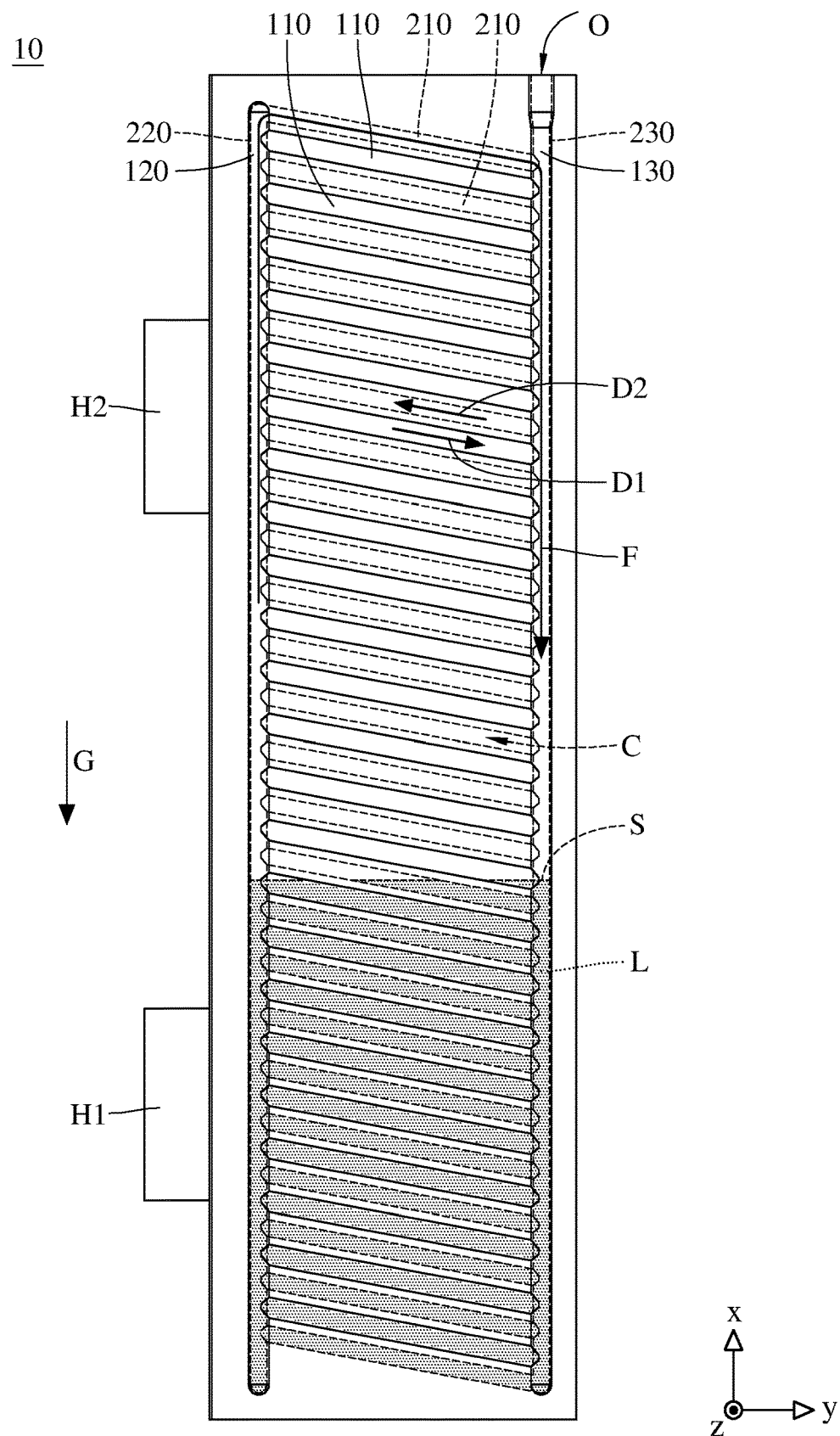
FIG. 5 is a schematic view of the heat dissipation plate in FIG. 1 in thermal contact with two heat sources and including a coolant.

FIG. 5 is a schematic view of the heat dissipation plate 10 of FIG. 1 in thermal contact with two heat sources H1 and H2 and including coolant L. As illustrated in FIG. 5, the coolant L partially fills the fluid channel C. The heat dissipation plate 10 is positioned vertically, and the first heat source H1 and the second heat source H2 are in thermal contact with the heat dissipation plate 10 and respectively located below and above the surface S of the coolant L. When the first heat source H1 is generating heat (e.g., during operation), the coolant L in liquid form absorbs heat generated by the first heat source H1 and changes to vapor that flows in a direction opposite the arrow G to a relatively cooler portion of the heat dissipation plate 10. Because, the second heat source H2 is also generating heat, the relatively cooler portion of the heat dissipation plate 10 is to the right in FIG. 5 adjacent to the second longitudinal groove 230. The coolant L in vapor form condenses to liquid again and flows back to the lower portion of the fluid channel C (e.g., the relatively hotter portion of the heat dissipation plate 10) along the second longitudinal groove 230. The circulation of the coolant in the heat dissipation plate 10 is indicated by the arrow F.

Due to the heat generated by the second heat source H2 (e.g., during operation), the coolant is drawn from the lower portion of the fluid channel C via the capillary structure 300 to the second heat source H2. The coolant L changes to vapor that flows in the direction indicated by the arrow D1 towards the relatively cooler portion of the heat dissipation plate 10. The coolant in vapor form flowing away from the second heat source H2 condenses to liquid due to the relatively cooler portion of the heat dissipation plate 10. The condensed coolant in liquid form is transported toward the heat source H2 as indicated by the arrow D2. As such, the coolant flow due to the second heat source H2 has a relatively smaller circulation path compared to coolant flow when dissipating heat from the first heat source H1.

Accordingly, the heat dissipation plate 10 is able to dissipate heat generated by a heat source whether it is located below or above the surface of the coolant.

The heat dissipation plate 10 can be manufactured using a composite plate including a welding material, or by using a non-composite (e.g., aluminum) plate not including a welding material (e.g., a material that cannot be welded).

In the method using a composite plate including a welding material, one or more stamping processes are performed on two plates both having the welding material to obtain the first plate 100 having the first plurality of inclined grooves 110 and the first and second longitudinal grooves 120 and 130, and to obtain the second plate 200 having the second plurality of inclined grooves 210 and the first and second longitudinal grooves 220 and 230.

The shapes and sizes of the grooves 110 and 210 and the longitudinal grooves 120, 130, 220, and 230 are not limited to any particular shape and size, and the shapes and sizes can vary as required by design and/or application. In some embodiments, the grooves 110 and 120 and the longitudinal grooves 120, 130, 220, and 230 may have different shapes and/or sizes in order to create a pressure difference for controlling the flowing direction of the vaporized coolant.

For example, the one or more grooves 110 of the first plate 100 may have a different cross-sectional shape or size. Similarly, the grooves 110 and the longitudinal grooves 120 and 130 of the first plate 100 may have a different cross-sectional shape or size. In other examples, the grooves 110 of the first plate 100 and the grooves 210 of the second plate 200 may have a different cross-sectional shape or size.

Then, powder is deposited in the second grooves 210 and the first and second longitudinal grooves 220 and 230 of the second plate 200 and the second plate 200 is heated to form the capillary structure 300 via sintering.

At the same time, a welding flux is provided on a welding surface of the second plate 200 that is not covered by the powder in order to clean the welding surface, and thereby improve the welding quality. However, in other embodiments, the welding flux is omitted.

The first plate 100 and the second plate 200 are coupled to each other (e.g., the plates may be stacked over each other) and are aligned with each other by a fixture and then welded. Thus, the welding and sintering operations are performed simultaneously. The fixture resists the stress occurring during the welding process and thus prevents the deformation of the first plate 100 and the second plate 200. The fixture is made of graphite or other materials which do not interact with the welding material.

Then, the first plate 100 and the second plate 200 are heated to melt the welding material and fix the first plate 100 and the second plate 200 to each other. In addition, the heating also sinters the powder to obtain the capillary structure 300.

Then, air in the fluid channel C is removed through the inlet O and then coolant L is filled into the fluid channel C through the inlet O. In one embodiment, a pipe is welded to the inlet O to suck out the air from the fluid channel C and to then introduce coolant L into the fluid channel C.

In the method using a non-composite plate not including a welding material (e.g., welding by using a solder), one or more stamping processes are performed on two plates not having welding material so as to obtain the first plate 100 having the first plurality of inclined grooves 110 and the first and second longitudinal grooves 120 and 130, and to obtain the second plate 200 having the second plurality of inclined grooves 210 and the first groove 220 and the second groove 230.

The shapes and sizes of the grooves 110 and 210 and the longitudinal grooves 120, 130, 220, and 230 are not limited to any particular shape and size, and the shapes and sizes can vary as required by design and/or application. In some embodiments, the grooves 110 and 120 and the longitudinal grooves 120, 130, 220, and 230 may have different shapes and/or sizes in order to create a pressure difference for controlling the flowing direction of the vaporized coolant.

For example, the one or more grooves 110 of the first plate 100 may have a different cross-sectional shape or size. Similarly, the grooves 110 and the longitudinal grooves 120 and 130 of the first plate 100 may have a different cross-sectional shape or size. In other examples, the grooves 110 of the first plate 100 and the grooves 210 of the second plate 200 may have a different cross-sectional shape or size.

Then, powder is deposited in the grooves 210 and the first and second longitudinal grooves 220 and 230 of the second plate 200. The powder is sintered to obtain the capillary structure 300. As discussed above, in one embodiment, the powder may be disposed in the grooves 210 and only one of the first and second longitudinal grooves 220 and 230 of the second plate 200.

Then, a welding material is provided on a surface to be welded of the second plate 200 that is not covered by the powder.

A welding flux is then provided on the welding material disposed on the second plate 200 to improve the welding quality.

The first plate 100 and the second plate 200 are coupled to each other (e.g., the plates may be stacked over each other) and are aligned with each other by a fixture. The fixture resists the stress occurring during the welding process and thus prevents the deformation of the first plate 100 and the second plate 200. The fixture is made of graphite or other materials which do not interact with the welding material.

The first plate 100 and the second plate 200 are welded together. Air in the fluid channel C is removed through the inlet O and coolant L is introduced into the fluid channel C through the inlet O. In one embodiment, a pipe may be welded to the inlet O of the heat dissipation plate 10 to and air may be sucked out of the fluid channel C via the pipe. Coolant L is then introduced into the fluid channel C using the pipe.

The capillary structure 300 is formed by disposing the powder at the grooves 210 and the first and second longitudinal grooves 220 and 230 of the second plate 200 and sintering it, but the present disclosure is not limited thereto. In other embodiments, the capillary structure may be first formed from the capillary powder, and then installed into the grooves 210 and the first and second longitudinal grooves 220 and 230 of the second plate 200. As a result, the capillary structure can be formed in the first plate 100 and the second plate 200.

Figure 6:
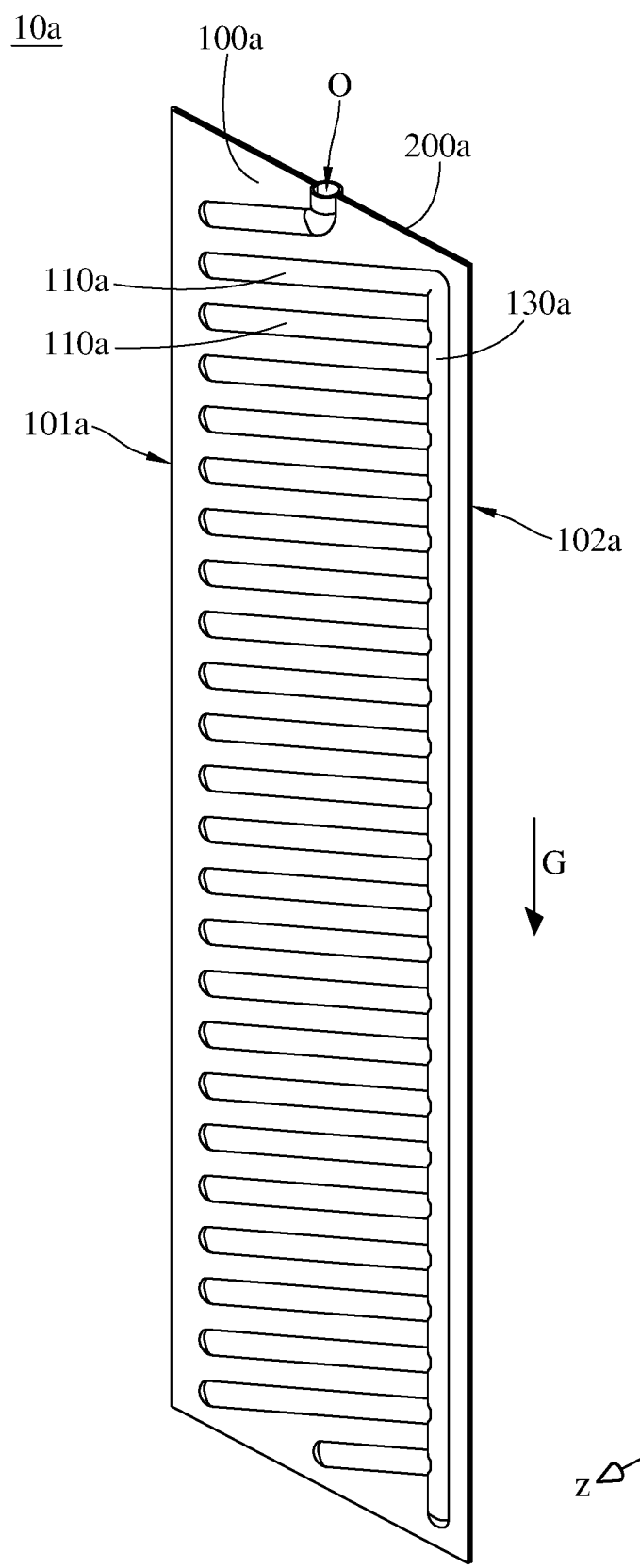
FIG. 6 is a perspective view of a heat dissipation plate according to an exemplary embodiment.
Figure 7:
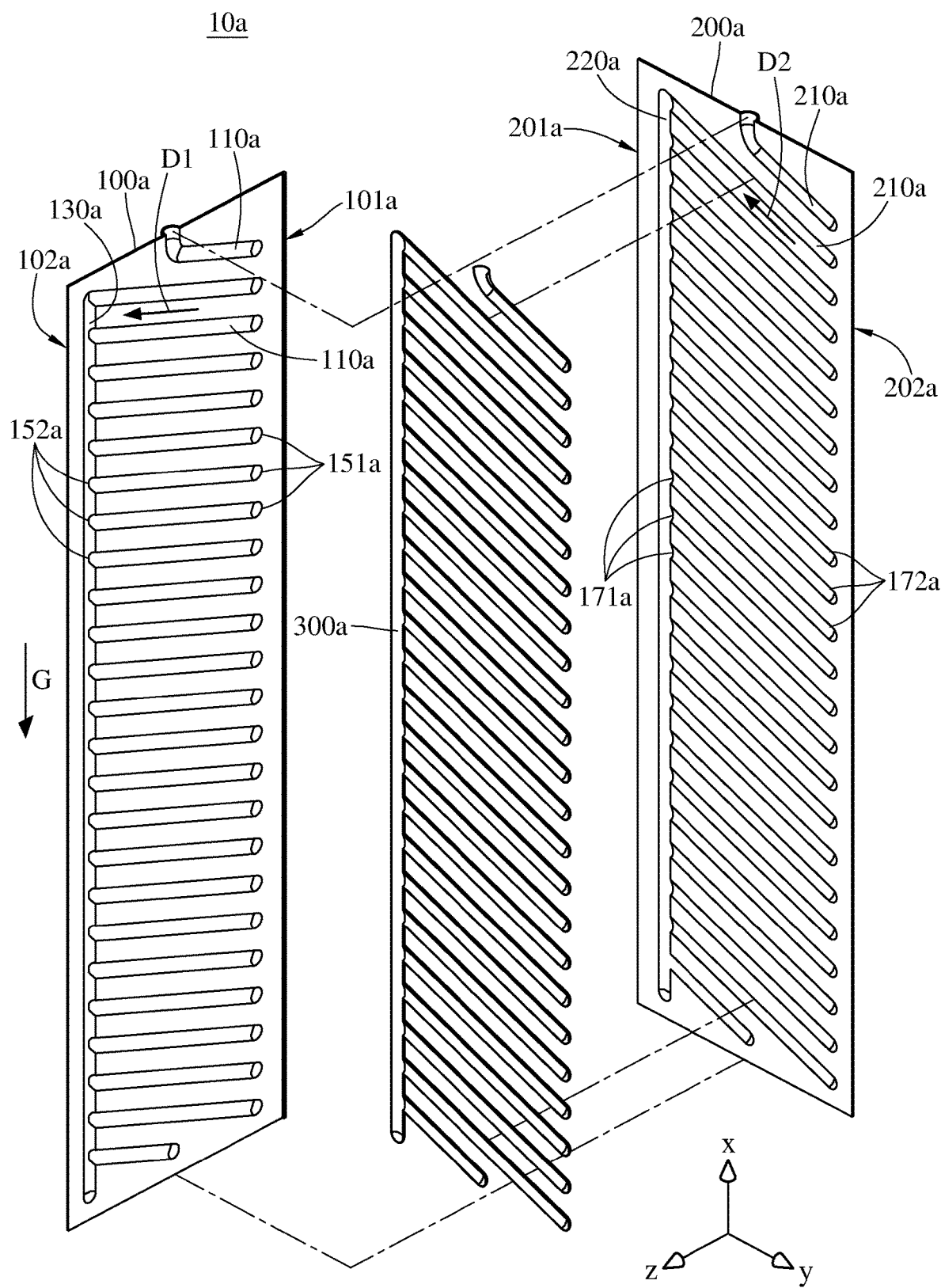
FIG. 7 is an exploded view of the heat dissipation plate in FIG. 6.
Figure 8:
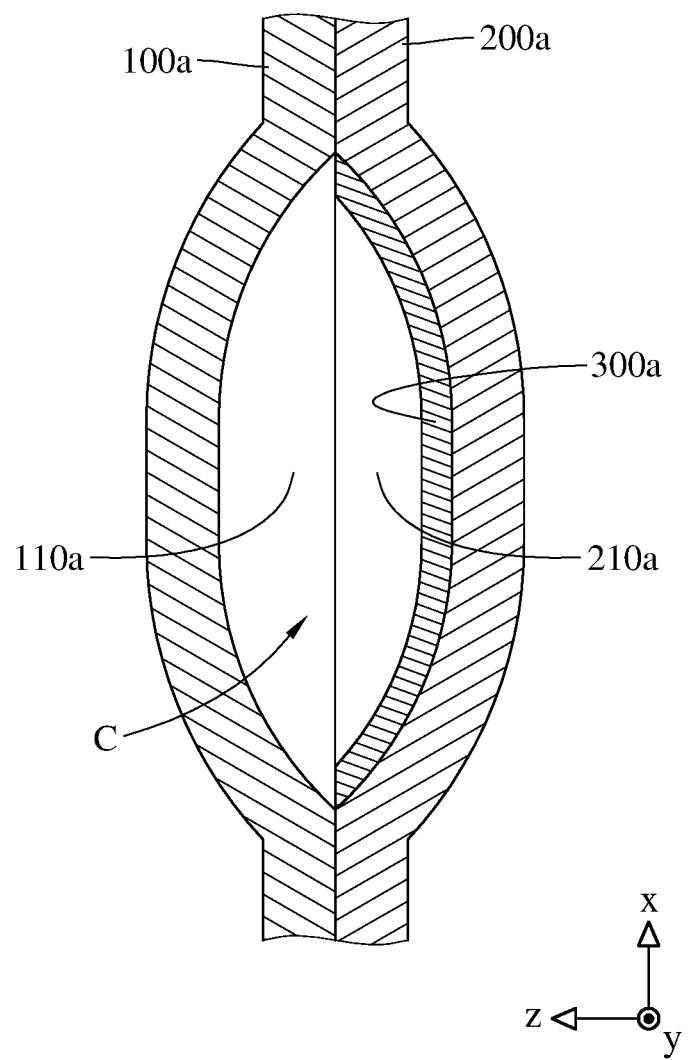
FIG. 8 is a partial cross-sectional view of the heat dissipation plate in FIG. 6.

FIG. 6 is a perspective view of a heat dissipation plate 10a according to another embodiment. FIG. 7 is an exploded view of the heat dissipation plate 10a in FIG. 6. FIG. 8 is a partial cross-sectional view of the heat dissipation plate 10a in FIG. 6.

The heat dissipation plate 10a includes a first plate 100a, a second plate 200a and a capillary structure 300a. The first plate 100a and the second plate 200a are disposed opposite each other and the capillary structure 300 is disposed between the first plate 100a and the second plate 200a.

The first plate 100a has a first longitudinal edge (or side) 101a and a second longitudinal edge (or side) 102a opposite each other. The first plate 100a further has a first plurality of inclined or angled grooves 110a disposed in the longitudinal direction (or the X-direction in FIG. 6) and spaced apart from each other. Each groove 110a is a recess (or concavity) that extends into the body of the first plate 100a and extends (in the Y-direction) between the first longitudinal edge 101a and the second longitudinal edge 102a. Referring to FIG. 7, each groove 110a includes a first end 151a adjacent the first longitudinal edge 101a and a second end 152a adjacent the second longitudinal edge 102a and opposite the first end 151a. As illustrated, the first end 151a is located lower than the second end 152a, and, as a result, the grooves 110a are disposed at an angle in the first plate 100a. It will be understood that the grooves 110a are considered angled or inclined with reference to the top (or bottom) edge of the first plate 100a.

The first plate 100a also includes a longitudinal groove 130a extending in the X-direction. The longitudinal groove 130a is located adjacent the second longitudinal edge 102a. The second ends 152a of the grooves 110a are in fluid communication with the longitudinal groove 130a. Thus, the grooves 110a are in fluid communication with each other through the longitudinal groove 130a. In FIG. 6, the first plate 100a is shown disposed vertically, and the direction indicated by the arrow G is the direction of the force of gravity.

The second plate 200a has a first longitudinal edge 201a and a second longitudinal edge 202a opposite each other. The second plate 200a also includes a second plurality of inclined or angled grooves 210a disposed in the longitudinal direction (or the X-direction in FIG. 6) and spaced apart from each other. Each groove 210a is a recess (or concavity) that extends into the body of the second plate 200a and extends (in the Y-direction) between the first longitudinal edge 201a and the second longitudinal edge 202a. Referring to FIG. 7, each groove 210a includes a first end 171a adjacent the first longitudinal edge 201a and a second end 172a adjacent the second longitudinal edge 202a and opposite the first end 171a. The first end 171a is located higher than the second end 172a, and, as a result, the grooves 210a are disposed at an angle in the second plate 200a. Referring to FIG. 7, it will be understood that the longitudinal grooves 110a and 210a are orientated in opposite directions. It will be understood that the grooves 210a are considered angled or inclined with reference to the top (or bottom) edge of the second plate 200a.

The second plate 200a includes a longitudinal groove 220a extending in the X-direction. The longitudinal groove 220a is located adjacent the first longitudinal edge 201a. The first ends 171a of the grooves 210 are in fluid communication with the longitudinal groove 220a. Thus, the grooves 210a are in fluid communication with each other through the longitudinal groove 220a.

As illustrated in FIG. 6, the second plate 200a is coupled to the first plate 100a such that portions of the inclined grooves 110a and portions of the inclined grooves 210a intersect each other and the inclined grooves 110a are connected in fluid communication with each other via the inclined groove 210a and the longitudinal groove 130a. The inclined grooves 110a, the inclined grooves 210a, the longitudinal groove 120a and the longitudinal groove 220a together form a fluid channel C that allows coolant L to flow therethrough. The fluid channel C is continuous throughout the heat dissipation plate 10a, although, as discussed below, the entire fluid channel C may not be filled with coolant L.

As illustrated, the longitudinal groove 130a and the longitudinal groove 220a are located at two opposite ends of the grooves 110a, but embodiments are not limited in this regard. In other embodiments, the longitudinal groove 130a and the longitudinal groove 220a may be located at the same end of the grooves 110a.

The heat dissipation plate 10a has an inlet O formed by the topmost groove 110a and the topmost groove 210a, each proximate the top of the heat dissipation plate 10a. The inlet O allows coolant L to be introduced into the fluid channel C.

The capillary structure 300a is located in the fluid channel C. The coolant does not completely fill the fluid channel C and only part of the fluid channel C is occupied by the coolant L. The capillary structure 300a extends from below a surface S of the coolant L to above the surface S of the coolant L. Stated otherwise, the capillary structure 300a is partially submerged in coolant. As illustrated, the capillary structure 300a is located in the grooves 210a and the longitudinal groove 220a of the second plate 200a.

However embodiments are not limited in this regard. In other embodiments, the capillary structure 300a may be disposed in the first plate 100a. In other embodiments, the heat dissipation plate 10a may have two capillary structures respectively disposed on the first plate 100a and the second plate 200a.

Furthermore, the capillary structure 300a may not be completely overlapped with the grooves 210a and the longitudinal groove 220a of the second plate 200a. Stated otherwise, the capillary structure 300a may not completely line the grooves 210a and the longitudinal groove 220a. In another embodiment, the capillary structure 300a may partially overlap or line the grooves 210a and the longitudinal groove 220a of the second plate 200a.

FIG. 8 illustrates a partial cross-sectional view of the heat dissipation plate 10a including the capillary structure 300a in the fluid channel C defined by grooves 110a and 210a. As illustrated, the capillary structure 300a lines the groove 210a, but does not completely fill (or occupy) the fluid channel C.

Figure 9:
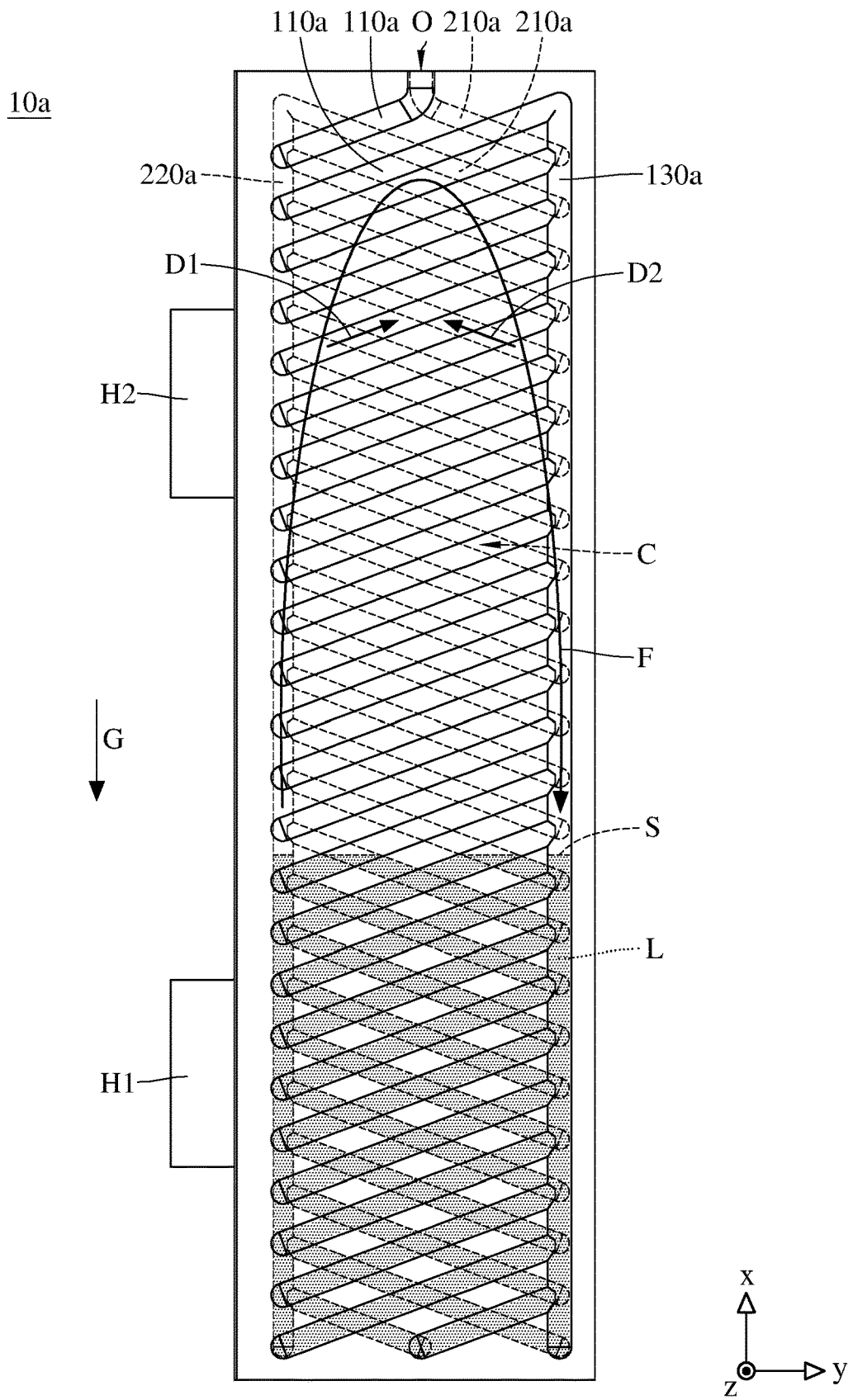
FIG. 9 is a schematic view of the heat dissipation plate in FIG. 6 in thermal contact with two heat sources and including a coolant.

FIG. 9 is a schematic view of the heat dissipation plate 10a in FIG. 6 in thermal contact with two heat sources H1 and H2 and including coolant L. In FIG. 9, coolant L partially fills the fluid channel C. The heat dissipation plate 10a is positioned vertically, and the first heat source H1 and the second heat source H2 are in thermal contact with the heat dissipation plate 10a and respectively located below and above the surface S of the coolant L. When the first heat source H1 is generating heat (e.g., during operation), the coolant L in liquid form absorbs heat generated by the first heat source H1 and changes to vapor that flows in a direction opposite the arrow G to a relatively cooler portion of the heat dissipation plate 10a. The coolant L in vapor form condenses to liquid and flows back to the lower portion of the fluid channel C (e.g., the relatively hotter portion of the heat dissipation plate 10a). The circulation of the coolant in the heat dissipation plate 10a is indicated by the arrow F.

Due to the heat generated by the second heat source H2, coolant is drawn from the lower portion of the fluid channel C via the capillary structure 300a to the second heat source H2. The coolant L changes to vapor that flows in the direction of arrow D1 towards the relatively cooler portion of the heat dissipation plate 10a. The coolant in the vapor form flowing away from the second heat source H2 condenses to liquid due to the relatively cooler portion of the heat dissipation plate 10a. The condensed coolant is transported towards the heat source H2 as indicated by the arrow D2. As such, the coolant flow due to the second heat source H2 has a relatively smaller circulation path compared to the coolant flow due to the first heat source H1.

Accordingly, the heat dissipation plate 10a is able to dissipate heat generated by the heat source whether it is located below or above the surface of the coolant.

The manufacturing process of the heat dissipation plate 10a is similar to that of the heat dissipation plate 10, thus a discussion thereof is omitted for the sake of brevity.

Figure 10:
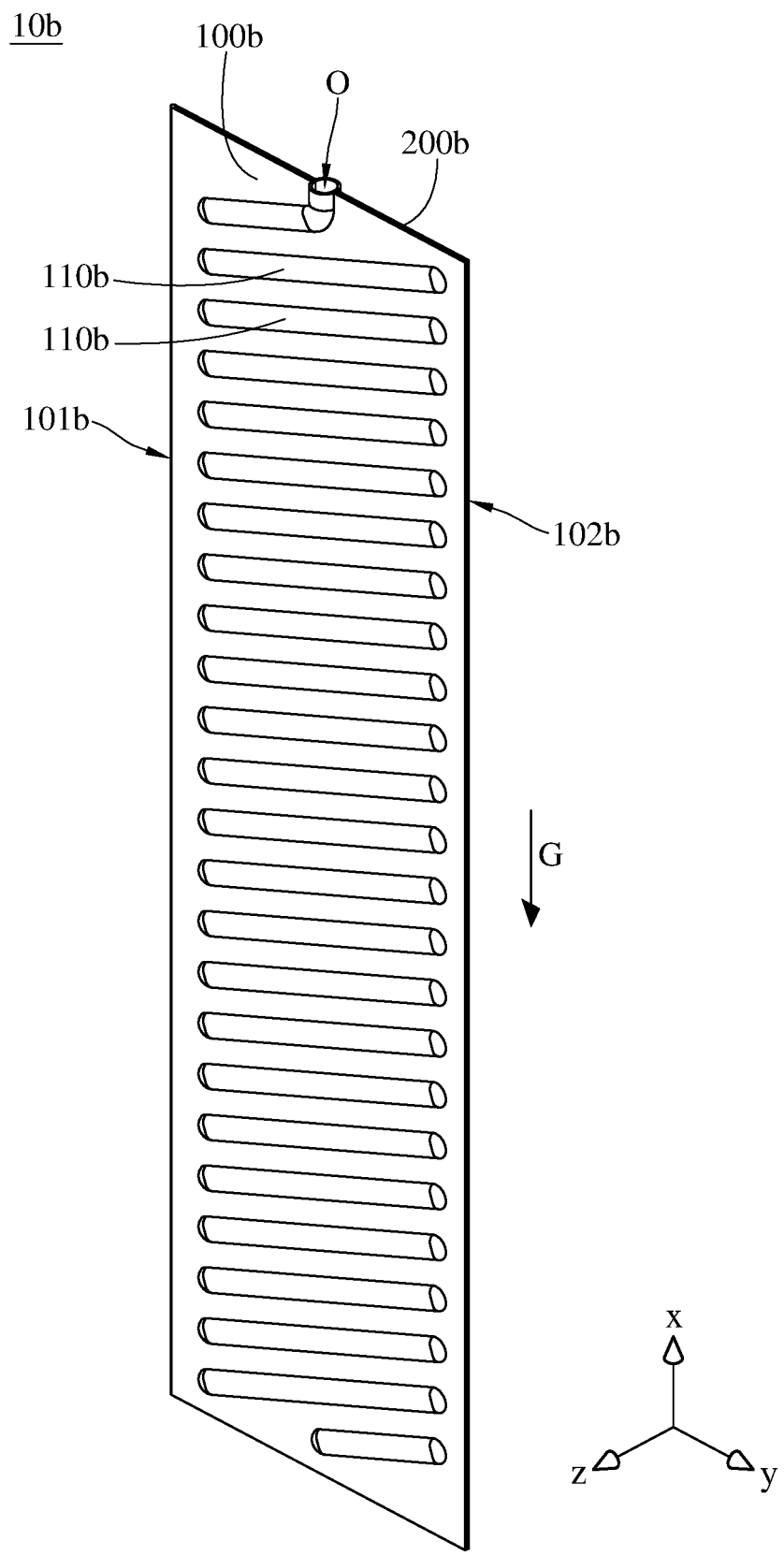
FIG. 10 is a perspective view of a heat dissipation plate according to an exemplary embodiment.
Figure 11:
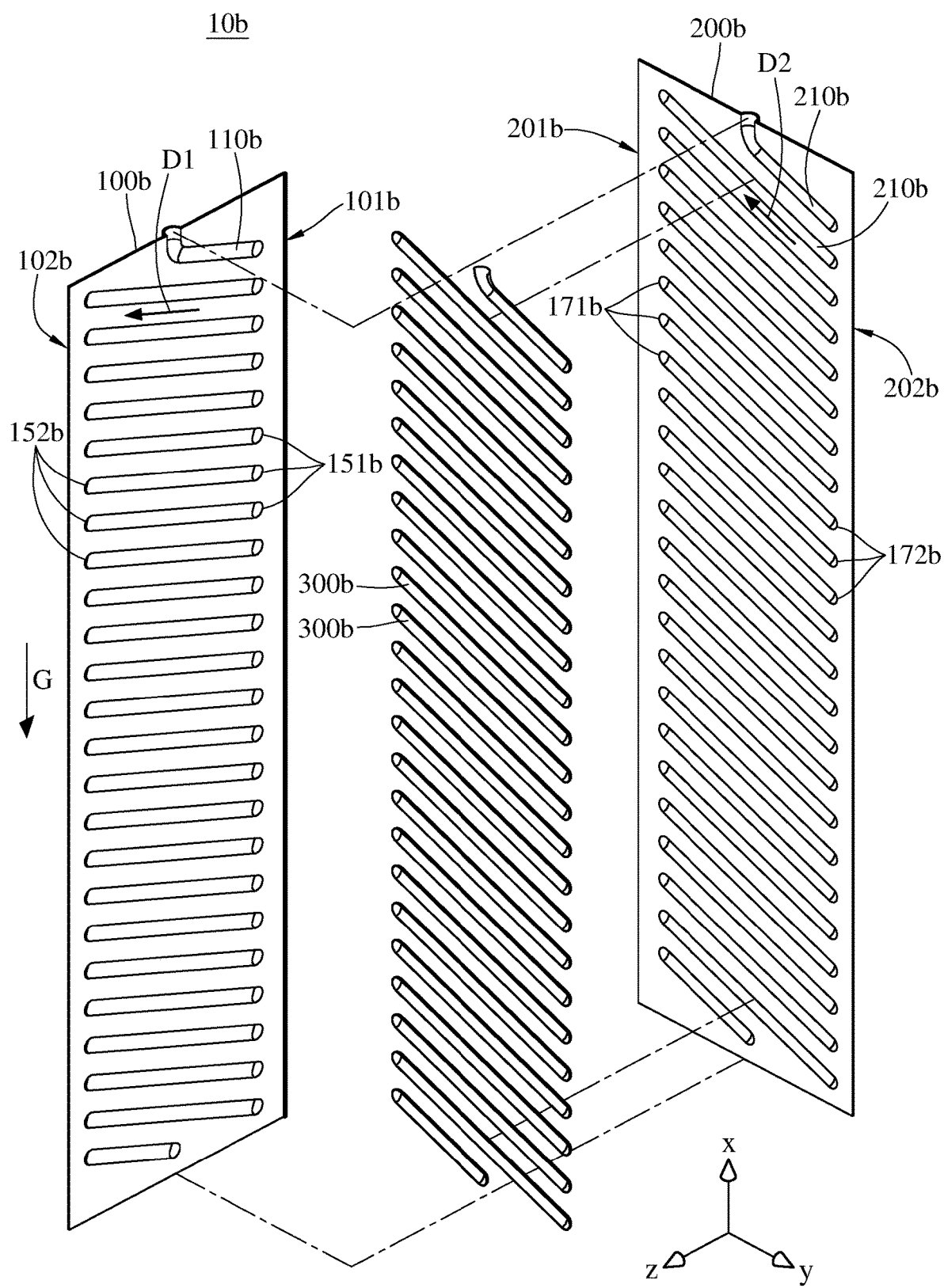
FIG. 11 is an exploded view of the heat dissipation plate in FIG. 10.
Figure 12:
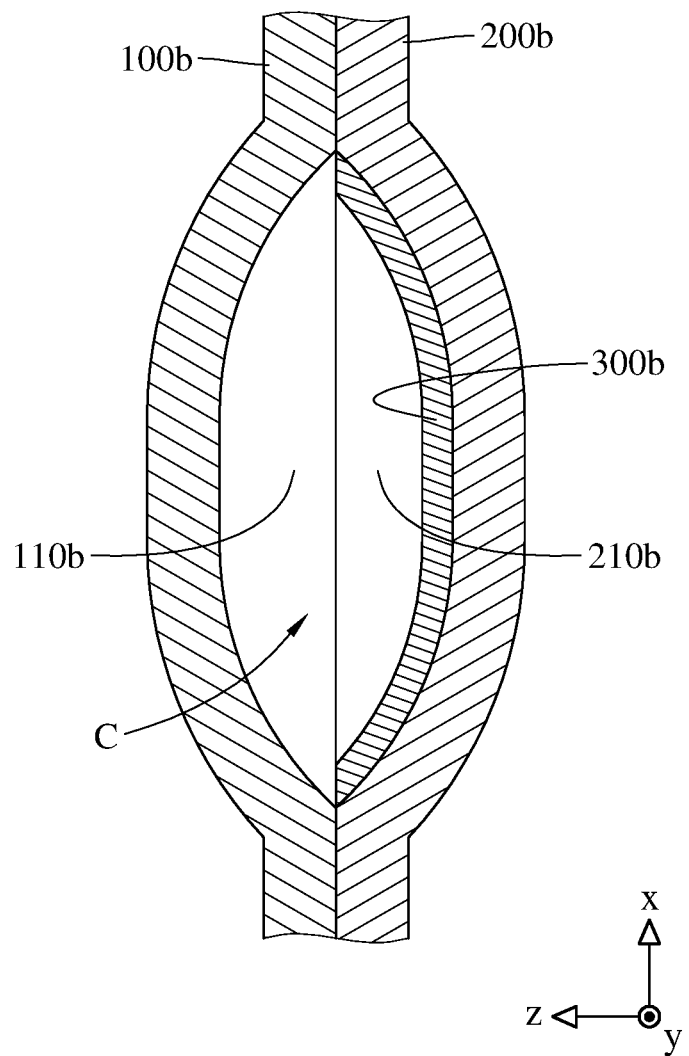
FIG. 12 is a partial cross-sectional view of the heat dissipation plate in FIG. 10.

FIG. 10 is a perspective view of a heat dissipation plate 10b according to an exemplary embodiment. FIG. 11 is an exploded view of the heat dissipation plate 10b in FIG. 10. FIG. 12 is a partial cross-sectional view of the heat dissipation plate 10b in FIG. 10.

The heat dissipation plate 10b includes a first plate 100b, a second plate 200b and a plurality of capillary structures 300b. The first plate 100b and the second plate 200b are disposed opposite each other and the capillary structures 300b are disposed between the first plate 100b and the second plate 200b.

The first plate 100b has a first longitudinal edge (or side) 101b and a second longitudinal edge (or side) 102b opposite each other. The first plate 100b further has a first plurality of inclined or angled grooves 110b disposed in the longitudinal direction (or the X-direction in FIG. 10) and spaced apart from each other. Each groove 110b is a recess (or a concavity) that extends into the body of the first plate 100b and extends (in the Y-direction) between the first longitudinal edge 101b and the second longitudinal edge 102b. Referring to FIG. 11, each groove 110b includes a first end 151b adjacent the first longitudinal edge 101b and a second end 152b adjacent the second longitudinal edge 102b and opposite the first end 151b. As illustrated, the first end 151b is located lower than the second end 152b, and, as a result, the grooves 110b are disposed at an angle in the first plate 100b. It will be understood that the grooves 110b are considered angled or inclined with reference to the top (or bottom) edge of the first plate 100b.

In FIG. 10, the first plate 100b is shown disposed vertically, and the direction indicated by the arrow G is the direction of the force of gravity.

The second plate 200b has a first longitudinal edge 201b and a second longitudinal edge 202b opposite each other. The second plate 200b includes a second plurality of inclined or angled grooves 210b disposed in the longitudinal direction (or the X-direction in FIG. 6) and spaced apart from each other. Each groove 210b is a recess (or concavity) that extends into the body of the second plate 200b and extends (in the Y-direction) between the first longitudinal edge 201b and the second longitudinal edge 202b. Referring to FIG. 11, each groove 210b includes a first end 171b adjacent the first longitudinal edge 201b and a second end 172b adjacent the second longitudinal edge 202b and opposite the first end 171b. The first end 171b is located higher than the second end 172b, and, as a result, the grooves 210b are disposed at an angle in the second plate 200b. It will be understood that the grooves 210b are considered angled or inclined with reference to the top (or bottom) edge of the second plate 200b. Referring to FIG. 11, it will be understood that the grooves 110b and 220b are orientated in opposite directions.

As illustrated in FIG. 10, the second plate 200b is coupled to the first plate 100b such that portions of the first grooves 110b and portions of the inclined grooves 210b intersect each other and the inclined grooves 110b are connected in fluid communication with each other via the inclined grooves 210b. The inclined grooves 110b and the inclined grooves 210b together form a fluid channel C that allows coolant L to flow therethrough. The fluid channel C is continuous throughout the heat dissipation plate 10b, although, as discussed below, the entire fluid channel C may not be filled with coolant L.

The heat dissipation plate 10b has an inlet O formed by topmost groove 110b and the topmost groove 210b, each located proximate the top of the heat dissipation plate 10b. The inlet O allows coolant L to be introduced into the fluid channel C.

The capillary structures 300b are located in the fluid channel C. The coolant L does not completely fill the fluid channel C and only part of the fluid channel C is occupied by the coolant L. The capillary structures 300b are arranged from below a surface S of the coolant L to above the surface S of the coolant L. Stated otherwise, the capillary structure 300b is partially submerged in coolant. In one embodiment and as illustrated, the capillary structures 300b are located in corresponding grooves 210b of the second plate 200b. However, embodiments are not restricted in this regard. In other embodiments, the capillary structures 300b may be disposed in the first plate 100b. In still other embodiments, the capillary structures 300b may be disposed in both the first plate 100b and the second plate 200b.

The capillary structures 300b may not completely overlapped or lined with the grooves 210b of the second plate 200b. In yet another embodiment, the capillary structures 300b may partially overlap or line the second grooves 210b of the second plate 200b.

FIG. 12 illustrates a partial cross-sectional view of the heat dissipation plate 10b including the capillary structure 300b in the fluid channel C defined by grooves 110b and 210b. As illustrated, the capillary structure 300b lines the groove 210b, but does not completely fill (or occupy) the fluid channel C.

Figure 13:
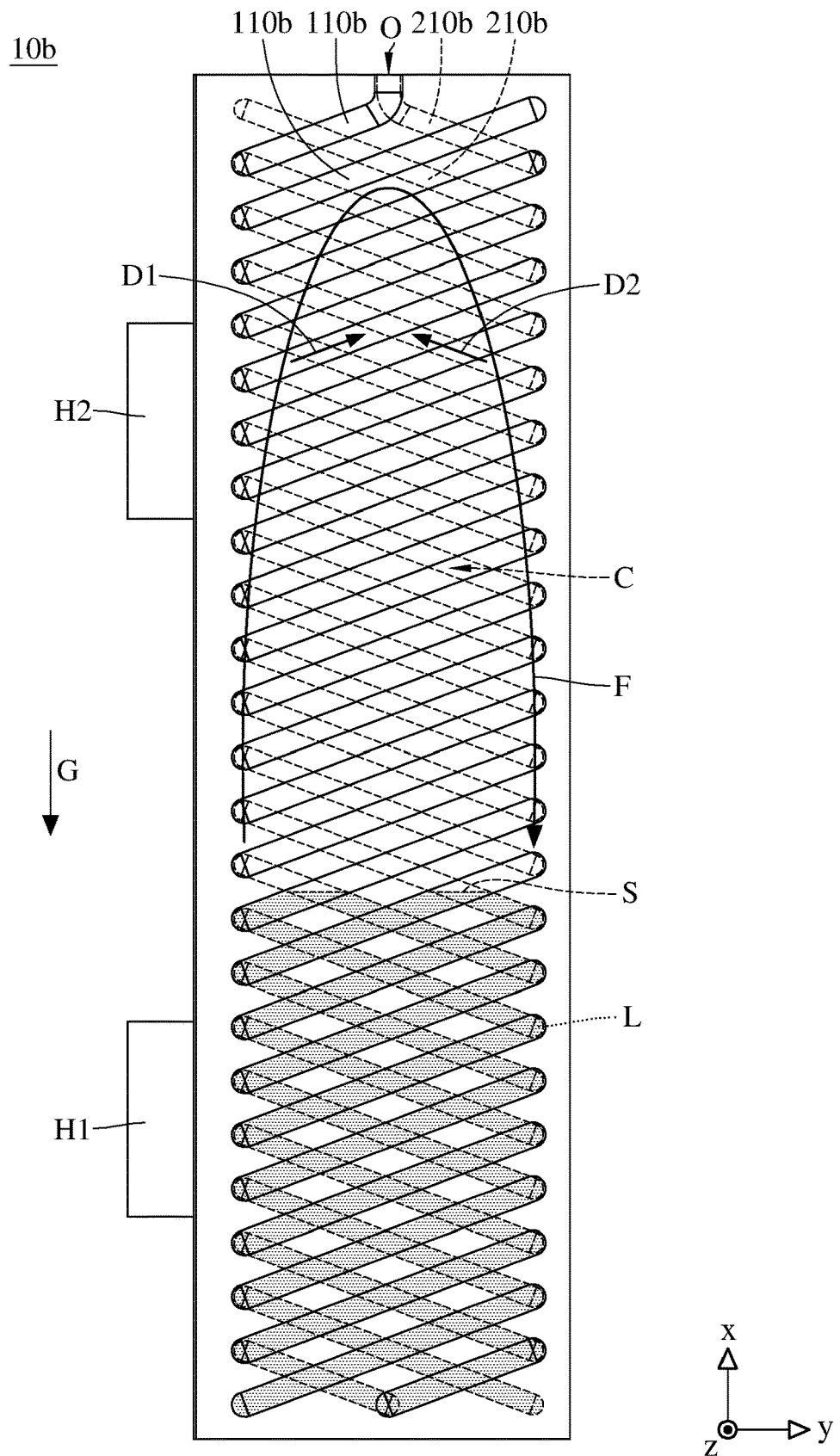
FIG. 13 is a schematic view of the heat dissipation plate in FIG. 10 in thermal contact with two heat sources and including a coolant.

FIG. 13 is a schematic view of the heat dissipation plate 10b in FIG. 10 in thermal contact with two heat sources H1 and H2 and including coolant L. In FIG. 13, coolant L partially fills the fluid channel C. The heat dissipation plate 10b is positioned vertically, and the first heat source H1 and the second heat source H2 are in thermal contact with the heat dissipation plate 10b and respectively located below and above the surface S of the coolant L. When the first heat source H1 is generating heat (e.g., during operation), the coolant L in liquid form absorbs heat generated by the first heat source H1 and changes to vapor that flows in a direction opposite the arrow G to a relatively cooler portion of the heat dissipation plate 10b. The coolant L in vapor form condenses to the liquid and flows back to the lower portion of the fluid channel C (e.g., the relatively hotter portion of the heat dissipation plate 10b). The circulation of the coolant in the heat dissipation plate 10b is indicated by the arrow F.

Due to the heat generated by the second heat source H2, coolant is drawn from the lower portion of the fluid channel C via the capillary structure 300b to the second heat source H2. The coolant L changes to vapor that flows in the direction of arrow D1 towards the relatively cooler portion of the heat dissipation plate 10b. The coolant in vapor form flowing away from the second heat source H2 condenses to liquid due to the relatively cooler portion of the heat dissipation plate 10b. The condensed coolant is transported towards the second heat source H2 as indicated by the arrow D2. As such, the coolant flow due to the second heat source H2 has a relatively smaller circulation path compared to the coolant flow due to the first heat source H1.

Accordingly, the heat dissipation plate 10b is able to dissipate heat generated by the heat sources whether it is located below or above the surface of the coolant.

The manufacturing process of the heat dissipation plate 10b is similar to that of the heat dissipation plate 10, and therefore a discussion thereof is omitted for the sake of brevity.

In the aforementioned example embodiments, the first plate and the second plate both have inclined grooves, but the disclosure is not limited in this regard. In other embodiments, only one of the first plate and the second plate may have inclined grooves.

According to the heat dissipation plate according to example embodiments discussed above, the capillary structure is disposed in the fluid channel, such that the coolant is able to flow against the force of gravity via the capillary structure and to the portion of the fluid channel close to the heat source located above the surface of the coolant. Therefore, the heat dissipation plate according to example embodiments is capable of dissipating heat generated by the heat source located below or above the surface of the coolant.

Figure 14:
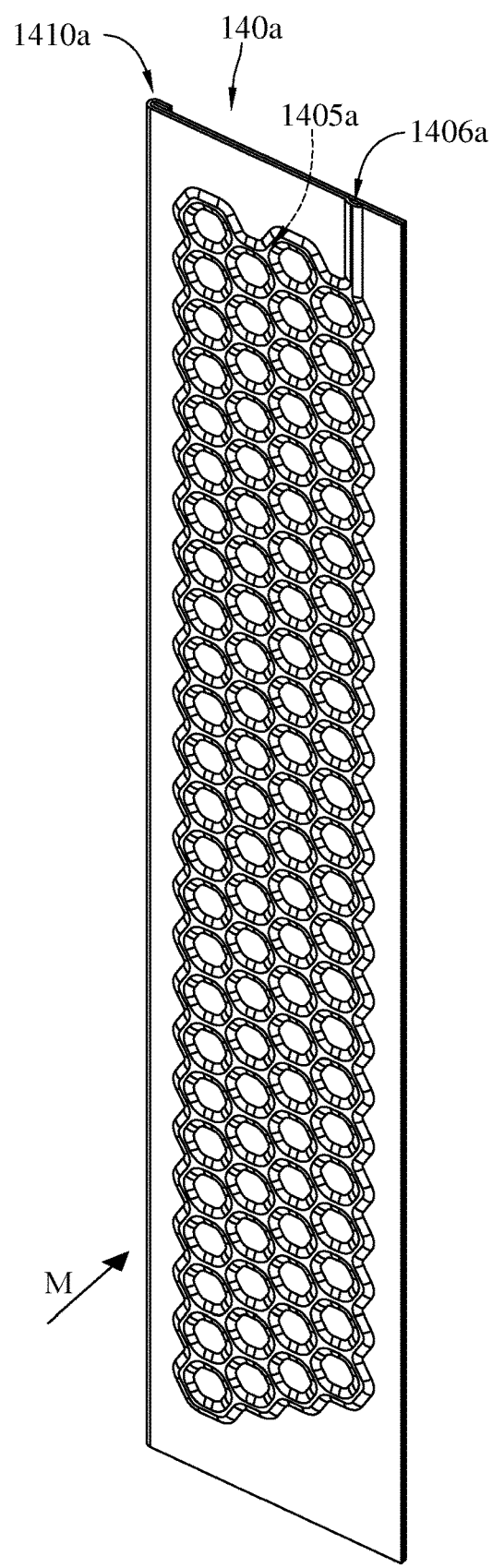
FIG. 14 is a perspective view of a roll-bonded heat exchanger according to an exemplary embodiment.
Figure 15:
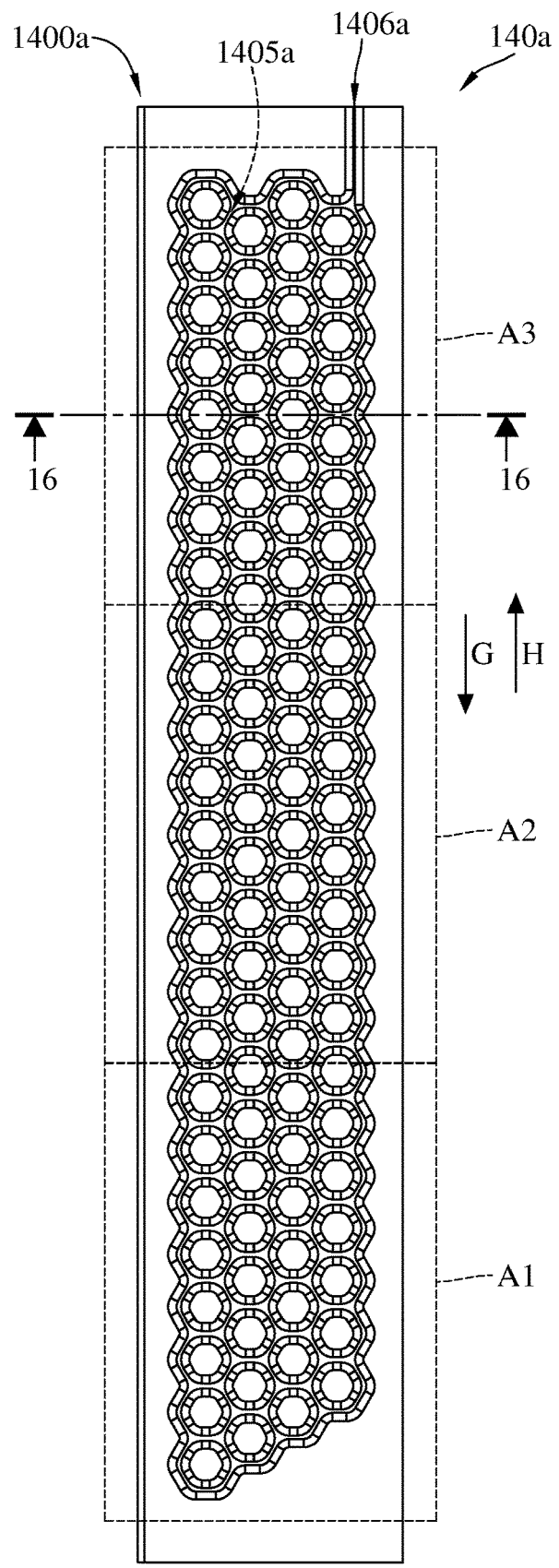
FIG. 15 is a front view of the roll-bonded heat exchanger in FIG. 14.
Figure 16:
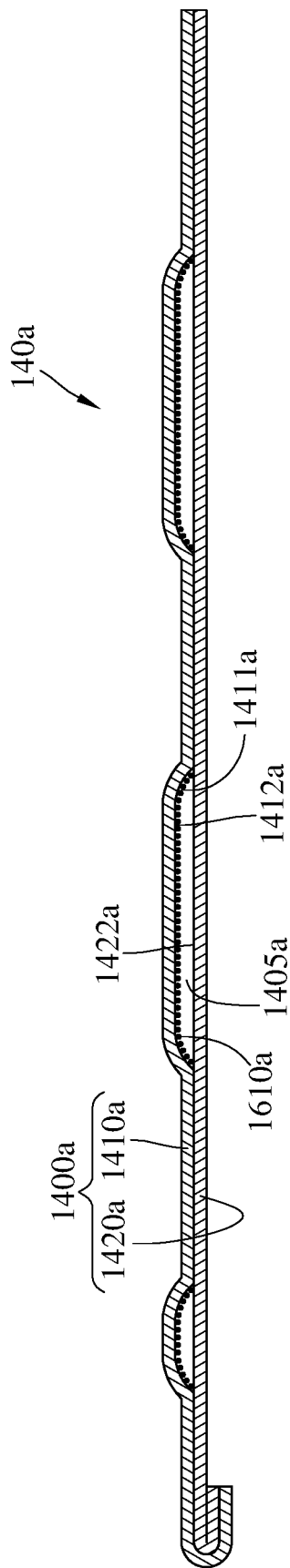
FIG. 16 is a partial cross-sectional view of the roll-bonded heat exchanger of FIG. 14 taken along line 16-16 in FIG. 15.

FIG. 14 is a perspective view of a roll-bonded heat exchanger 140a according to an exemplary embodiment. FIG. 15 is a front view of the roll-bonded heat exchanger 140a viewed in the direction of arrow M. FIG. 16 is a partial cross-sectional view of the roll-bonded heat exchanger 140a along line 16-16 in FIG. 15. It should be noted that, although example embodiments are discussed below with reference to a roll-bonded heat exchanger, the example embodiments are not limited thereto and are equally applicable to other types of heat dissipating devices without departing from the spirit and scope of the disclosure.

The roll-bonded heat exchanger 140a dissipates heat generated by a heat source (e.g., an electronic circuit) that is in thermal contact with the roll-bonded heat exchanger 140a. The heat source is, for example, a central processing unit (CPU), but embodiments are not limited thereto. Referring to FIG. 16, the roll-bonded heat exchanger 140a includes a heat conducting plate structure 1400a and a capillary structure 1610a enclosed within the heat conducting plate structure 1400a. The heat conducting plate structure 1400a includes a channel 1405a and an opening 1406a that are connected to each other. The channel 1405a is sized and shaped (or otherwise configured) to include a coolant (not shown). The coolant is, for example, water or refrigerant, but embodiments are not limited thereto. The coolant may occupy about 30 to 70 percent of the volume of the channel 1405a. However, in other embodiments, the volume of the channel 1405a occupied by the coolant can be more or less as required. The coolant can be introduced into the channel 1405a via the opening 1406a.

The heat conducting plate structure 1400a includes a first plate 1410a and a second plate 1420a sealingly bonded with each other. The first plate 1410a includes a first surface 1412a that defines (or otherwise includes) a first recess (or a concavity) 1411a. The second plate 1420a includes a second surface 1422a that is planar. The second surface 1422a faces the first surface 1412a when the first plate 1410a and the second plate 1420a are bonded with each other. As illustrated, in such an arrangement, the first recess 1411a is located between the first surface 1412a and the second surface 1422a. The first surface 1412a and the second surface 1422a cooperatively define the channel 1405a.

As shown in FIG. 15, the roll-bonded heat exchanger 140a includes a refrigerant area A1, a cooling area A2 and a heat absorbing area A3. The refrigerant area A1 is located below the heat absorbing area A3, and the cooling area A2 is located between the refrigerant area A1 and the heat absorbing area A3. When the roll-bonded heat exchanger 140a is used to dissipate heat from a heat source, the heat absorbing area A3, the cooling area A2, and the refrigerant area A1 are arranged along a gravitational direction indicated by the arrow G with the refrigerant area A1 being the bottom-most portion of the roll-bonded heat exchanger 140*a*. The refrigerant area A1 of the roll-bonded heat exchanger 140*a* is configured to store the coolant. The cooling area A2 of the roll-bonded heat exchanger 140*a* is configured to release the heat in the gas-phase coolant and thereby condense the gas-phase coolant to the liquid-phase coolant. The heat absorbing area A3 of the roll-bonded heat exchanger 140*a* is configured to be in thermal contact with the heat source to absorb the heat generated by the heat source.

The capillary structure 1610*a* is located in the channel 1405*a* and disposed on the entire first surface 1412*a* and extends from the refrigerant area A1 to the heat absorbing area A3.

When the coolant in the heat absorbing area A3 of the roll-bonded heat exchanger 140*a* absorbs the heat generated by the heat source, the coolant is vaporized to the gas phase. The pressure difference is created in the roll-bonded heat exchanger 140*a* and this causes the vaporized coolant to flow from the heat absorbing area A3 to the cooling area A2. Then, the vaporized coolant is condensed to the liquid phase in the cooling area A2. The liquid-phase coolant flows back to the heat absorbing area A3 along a direction indicated by the arrow H opposite to the gravitational direction via the capillary structure 1610*a*. A portion of the liquid-phase coolant also flows to the refrigerant area A1. The coolant is thus circulated in the channel 1405*a*.

Figure 17:
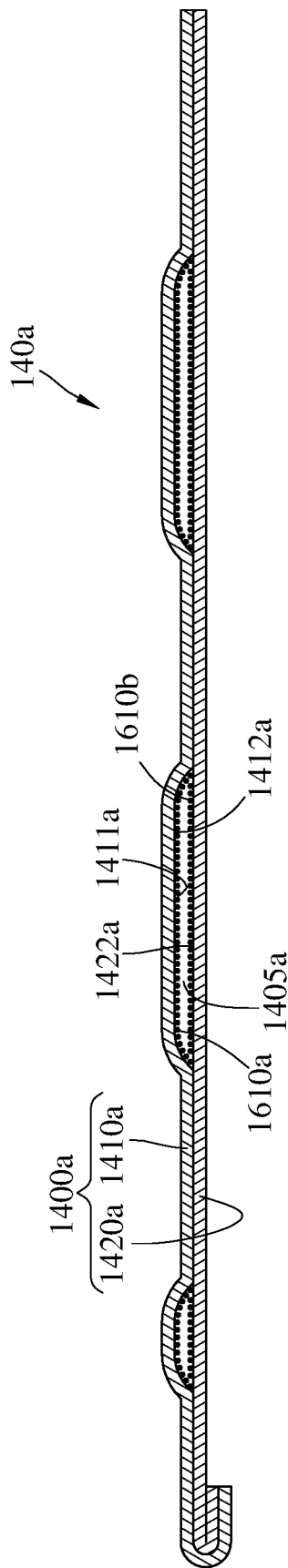
FIG. 17 is a partial cross-sectional view of a roll-bonded heat exchanger according to an exemplary embodiment.

In other embodiments, the capillary structure may also be disposed on the second surface 1422*a* of the second plate 1420*a*. FIG. 17 illustrates a partial cross-sectional view of the roll-bonded heat exchanger 140*a* according to an exemplary embodiment. As illustrated, a capillary structure 1610*b* is disposed over the entire second surface 1422*a* of the second plate 1420*a* in addition to the capillary structure 1610*a* being disposed over the entire first surface 1412*a* of the first plate 1410*a*. However, embodiments are not limited in this regard and in other embodiments, the capillary structure 1610*b* may be disposed on only portions of the second surface 1422*a*.

Figure 18:
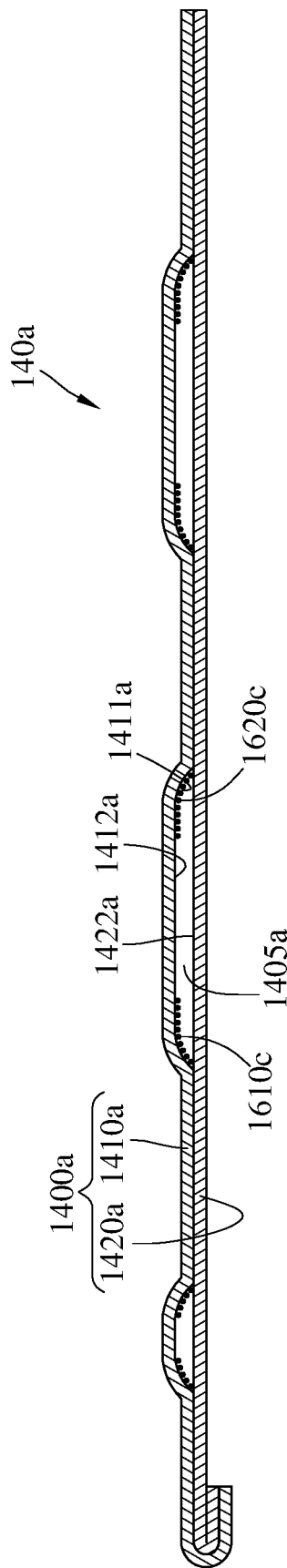
FIG. 18 is a partial cross-sectional view of a roll-bonded heat exchanger according to an exemplary embodiment.

It should be noted that the number of capillary structures in the roll-bonded heat exchanger 140*a* is not limited in any regard. FIG. 18 is a partial cross-sectional view of the roll-bonded heat exchanger 140*a* according to an exemplary embodiment. As shown in FIG. 18, the roll-bonded heat exchanger 140*a* includes two capillary structures 1610*c* and 1620*c* spaced apart from each other and arranged adjacent opposite ends of the first surface 1412*a* in the first recess 1411*a*.

Figure 19:
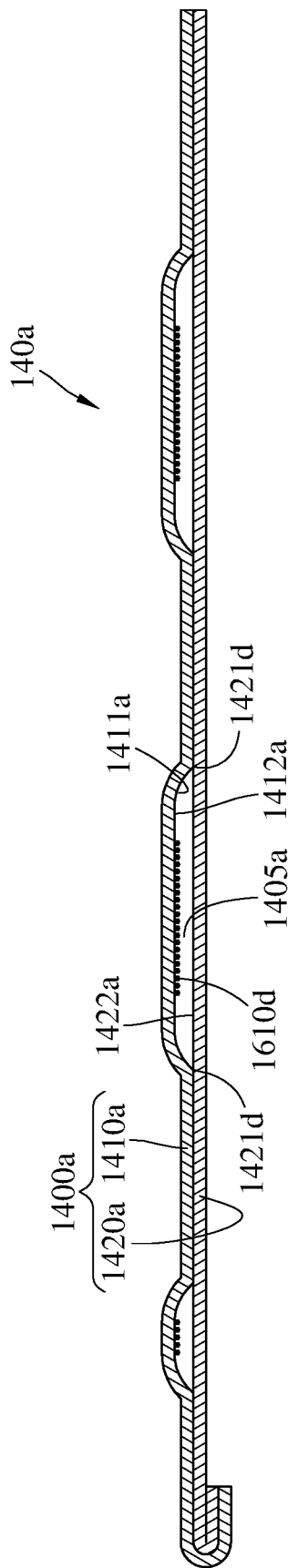
FIG. 19 is a partial cross-sectional view of a roll-bonded heat exchanger according to an exemplary embodiment.

FIG. 19 is a partial cross-sectional view of the roll-bonded heat exchanger 140*a* according to an exemplary embodiment. As shown in FIG. 19, the roll-bonded heat exchanger 140*a* includes a single capillary structure 1610*d* disposed on the first surface 1412*a* and in the first recess 1411*a* and spaced from two opposite edges 1421*d* of the first recess 1411*a*. In one embodiment, the capillary structure 1610*d* may be located centrally in the first recess 1411*a* on the first surface 1412*a*.

Figure 20:
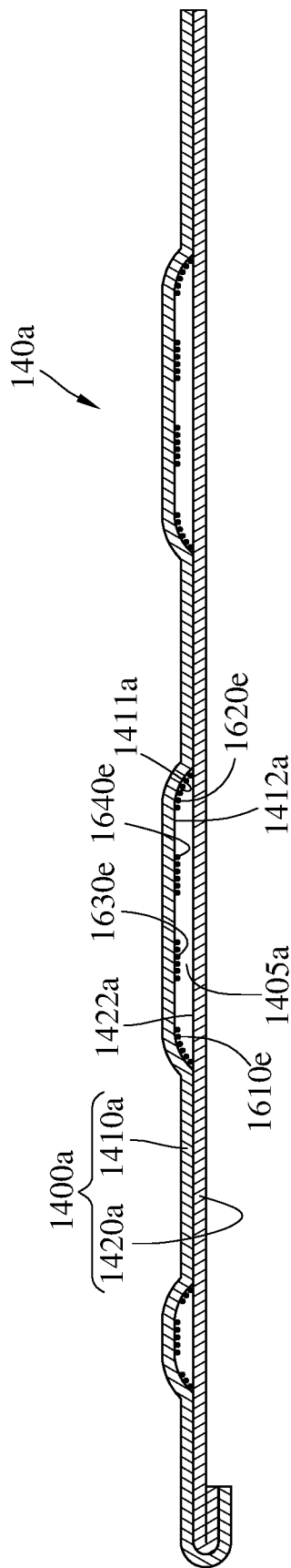
FIG. 20 is a partial cross-sectional view of a roll-bonded heat exchanger according to an exemplary embodiment.

FIG. 20 is a partial cross-sectional view of the roll-bonded heat exchanger 140*a* according to an exemplary embodiment. As shown in FIG. 20, the roll-bonded heat exchanger 140*a* includes multiple capillary structures on the first surface 1412*a* in the first recess 1411*a*. As illustrated, the roll-bonded heat exchanger 140*a* includes a first capillary structure 1610*e*, a second capillary structure 1620*e*, a third capillary structure 1630*e*, and a fourth capillary structure 1640*e* on the first surface 1412*a* in the first recess 1411*a*. The first capillary structure 1610*e*, the second capillary structure 1620*e*, the third capillary structure 1630*e*, and the fourth capillary structure 1640*e* are spaced apart from each other. The first capillary structure 1610*e* and the second capillary structure 1620*e* are arranged adjacent two opposite ends of the first surface 1412*a*. The third capillary structure 1630*e* and fourth capillary structure 1640*e* are arranged on the first surface 1412*a* between the first capillary structure 1610*e* and the second capillary structure 1620*e*.

Figure 21:
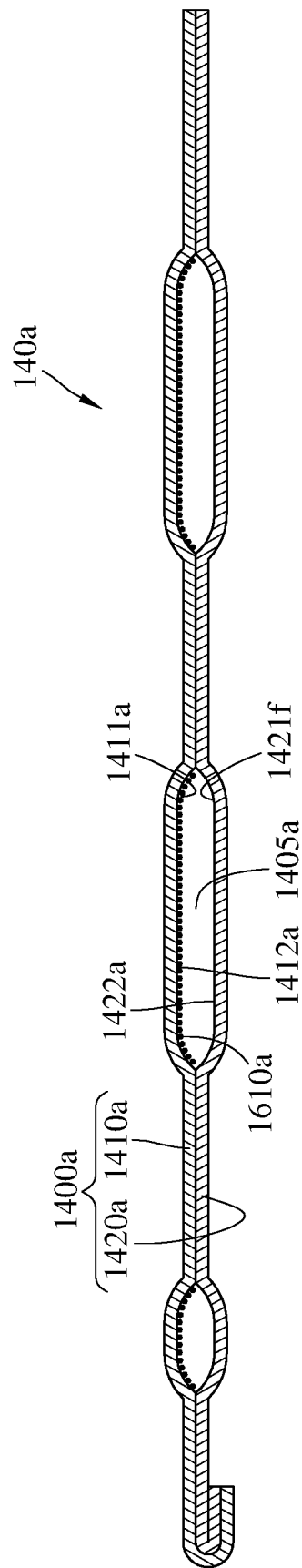
FIG. 21 is a partial cross-sectional view of a roll-bonded heat exchanger according to an exemplary embodiment.

In example embodiments, the second surface 1422*a* of the roll-bonded heat exchanger 140*a* may not be planar. FIG. 21 is a partial cross-sectional view of the roll-bonded heat exchanger 140*a* according to an exemplary embodiment. As shown in FIG. 21, the second surface 1422*a* of the second plate 1420*a* defines (or includes) a second recess (or concavity) 1421*f*. The second recess 1421*f* is aligned with the first recess 1411*a* such that the ends of the first recess 1411*a* contact the ends of the second recess 1421*f*. The first surface 1412*a* in the first recess 1411*a* and the second surface 1422*a* in the second recess 1421*f* cooperatively define the channel 1405*a* of the roll-bonded heat exchanger 140*a*. Capillary structure 1610*a* is located in the channel 1405*a* and disposed on the entire first surface 1412*a* in the first recess 1411*a*. However, embodiments are not limited in this regard. In other embodiments, the capillary structure 1610*a* may be disposed only on a portion of the first surface 1412*a*.

Figure 22:
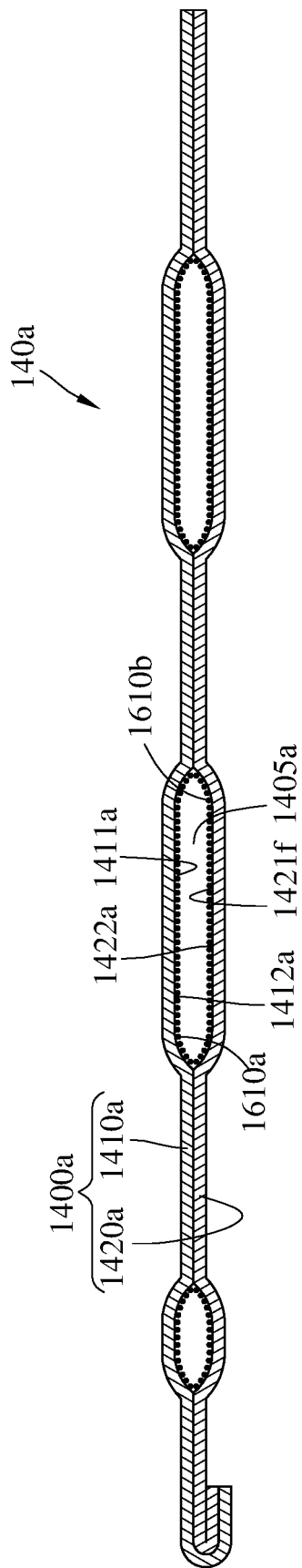
FIG. 22 is a partial cross-sectional view of a roll-bonded heat exchanger according to an exemplary embodiment.

FIG. 22 is a partial cross-sectional view of a roll-bonded heat exchanger according to an exemplary embodiment. Compared to the embodiment shown in FIG. 21, in the embodiment in FIG. 22, capillary structure 1610*b* is disposed on the entire second surface 1422*a* in addition to the capillary structure 1610*a* disposed on the entire first surface 1412*a*. However, embodiments are not limited in this regard. In other embodiments, the capillary structures 1610*a* and 1610*b* may be disposed only on portions of the respective first and second surfaces 1412*a* and 1422*a*.

Figure 23:
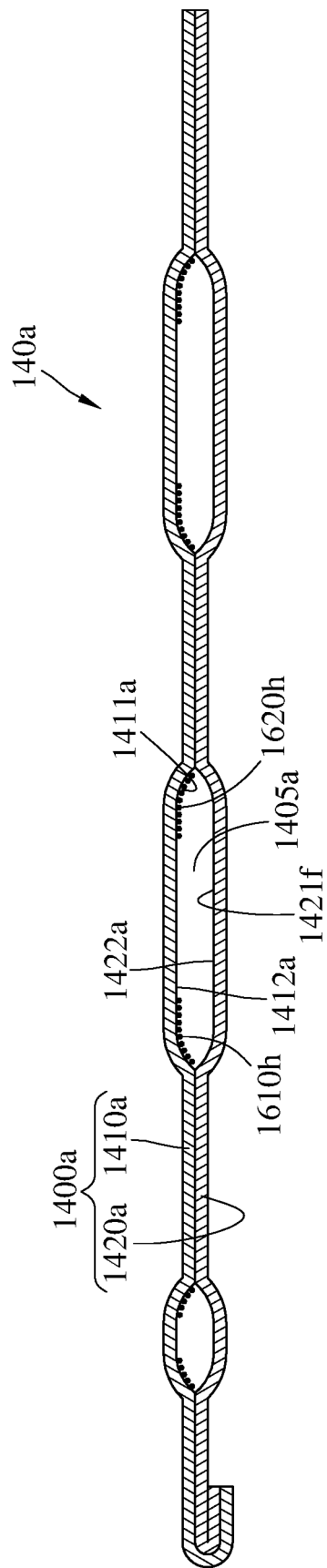
FIG. 23 is a partial cross-sectional view of a roll-bonded heat exchanger according to an exemplary embodiment.

FIG. 23 is a partial cross-sectional view of a roll-bonded heat exchanger according to an exemplary embodiment. Compared to the embodiment shown in FIG. 22, in the embodiment in FIG. 23, the channel 1405*a* includes two capillary structures 1610*h* and 1620*h* spaced apart from each other and respectively disposed adjacent the two opposite ends of the first surface 1412*a*. However, in other embodiments, capillary structures 1610*h* and 1620*h* may be disposed adjacent the two opposite ends of the second surface 1422*a*. In still other embodiments, capillary structures may be disposed on both the first surface 1412*a* and the second surface 1422*a*.

Figure 24:
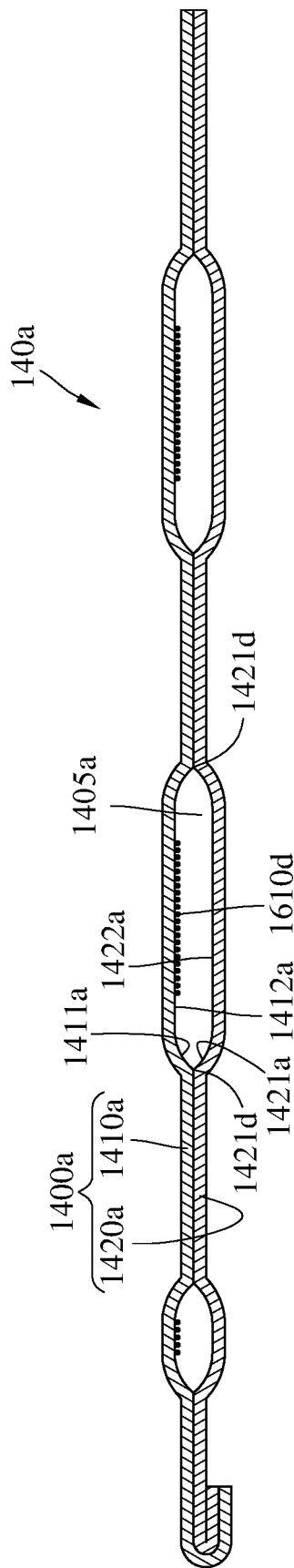
FIG. 24 is a partial cross-sectional view of a roll-bonded heat exchanger according to an exemplary embodiment.

FIG. 24 is a partial cross-sectional view of a roll-bonded heat exchanger 140*a* according to an exemplary embodiment. As shown in FIG. 24, the roll-bonded heat exchanger 140*a* includes a single capillary structure 210*i* disposed on the first surface 1412*a* and in the first recess 1411*a* and spaced from the opposite edges 1421*d* of the first recess 1411*a*. In one embodiment, the capillary structure 210*i* may be located centrally in the first recess 1411*a* on the first surface 1412*a*. However, in other embodiments, the capillary structure 210*i* may be disposed on the second surface 1422*a* in the recess 1421*a*. In still other embodiments, capillary structures may be disposed on both the first surface 1412*a* and the second surface 1422*a*.

Figure 25:
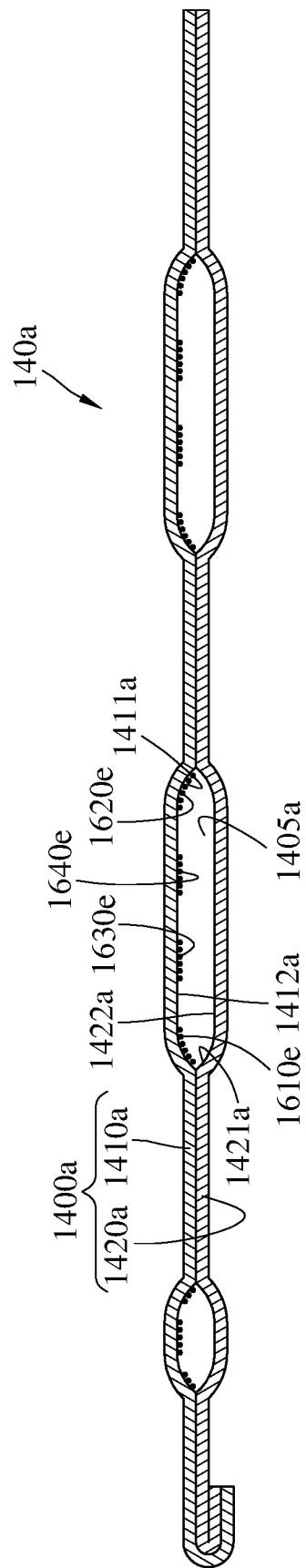
FIG. 25 is a partial cross-sectional view of a roll-bonded heat exchanger according to an exemplary embodiment.

FIG. 25 is a partial cross-sectional view of the roll-bonded heat exchanger 140*a* according to an exemplary embodiment. As shown in FIG. 25, the roll-bonded heat exchanger 140*a* includes the first capillary structure 1610*e*, the second capillary structure 1620*e*, the third capillary structure 1630*e*, and the fourth capillary structure 1640*e* on the first surface 1412*a* in the first recess 1411*a*. The first capillary structure 1610*e*, the second capillary structure 1620*e*, the third capillary structure 1630e, and the fourth capillary structure 1640e are spaced apart from each other. The first capillary structure 1610e and the second capillary structure 1620e are respectively located on two opposite ends of the first surface 1412a. The third capillary structure 1630e and fourth capillary structure 1640e are spaced apart from each other and arranged on the first surface 1412a between the first capillary structure 1610e and the second capillary structure 1620e. However, in other embodiments, the first capillary structure 1610e, the second capillary structure 1620e, the third capillary structure 1630e, and the fourth capillary structure 1640e may be disposed on the second surface 1422a in the recess 1421a. In still other embodiments, the four capillary structures may be disposed on both the first surface 1412a and the second surface 1422a.

The capillary structures 1610a, 1610b, 1610c, 1620c, 1610d, 1610e, 1620e, 1630e, 1640e, 1610h, and 1620h may be made of or otherwise include a metal, such as aluminum, copper, nickel or titanium. Alternatively, the capillary structures 1610a, 1610b, 1610c, 1620c, 1610d, 1610e, 1620e, 1630e, 1640e, 1610h, and 1620h may be made of or otherwise include a non-metallic material, such as carbon tube, graphite, glass fiber or polymer. The capillary structures 1610a, 1610b, 1610c, 1620c, 1610d, 1610e, 1620e, 1630e, 1640e, 1610h, and 1620h may include vent holes, grooves, planar or three-dimensional woven meshes (or tube bundles), or the combination thereof.

The capillary structures 1610a, 1610b, 1610c, 1620c, 1610d, 1610e, 1620e, 1630e, 1640e, 1610h, and 1620h may be manufactured by (1) filling powder in the channel 1405a and sintering the powder, (2) inserting a molded capillary structure in the channel, or (3) placing a molded capillary structure in graphite printing tubes in the bottom and top metal plates (e.g., plates 1410a and 1420a). Briefly, in graphite printing, a pre-determined pattern of the capillary structures is printed on surfaces of the top and bottom plates prior to roll bonding the plates. This prevents the top and bottom plates from completely bonded together.

The capillary structures 1610a, 1610b, 1610c, 1620c, 1610d, 1610e, 1620e, 1630e, 1640e, 1610h, and 1620h may also be manufactured by directly replacing the material of the graphite printing tubes by the capillary structure made from a carbon tube or polymer, a stamping process, sandblasting surfaces of the bottom and top metal plates (e.g., plates 1410a and 1420a), or etching the surfaces of the bottom and top metal plates (e.g., plates 1410a and 1420a).

Figure 26:
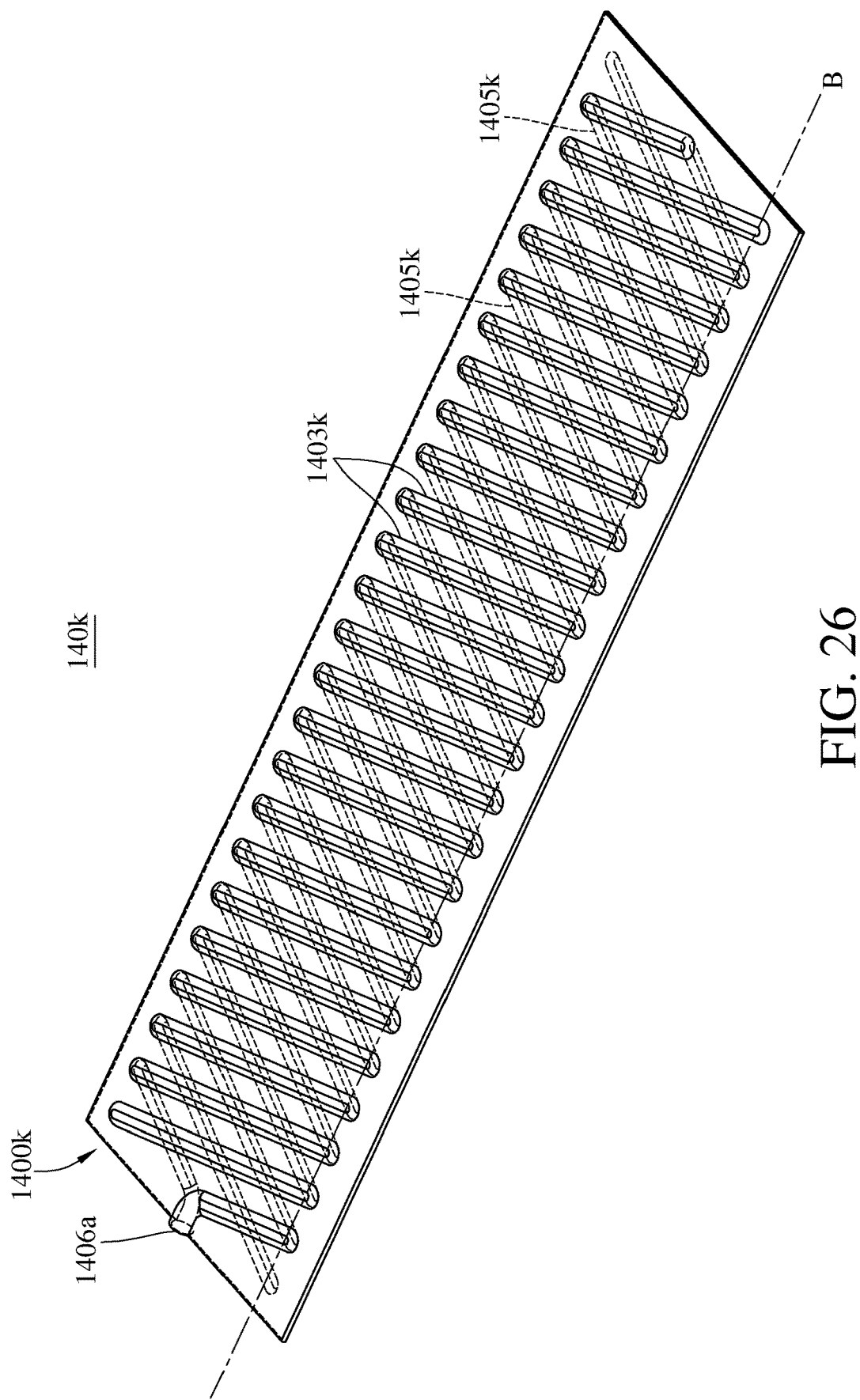
FIG. 26 is a partial cross-sectional view of a roll-bonded heat exchanger according to an exemplary embodiment.
Figure 27:
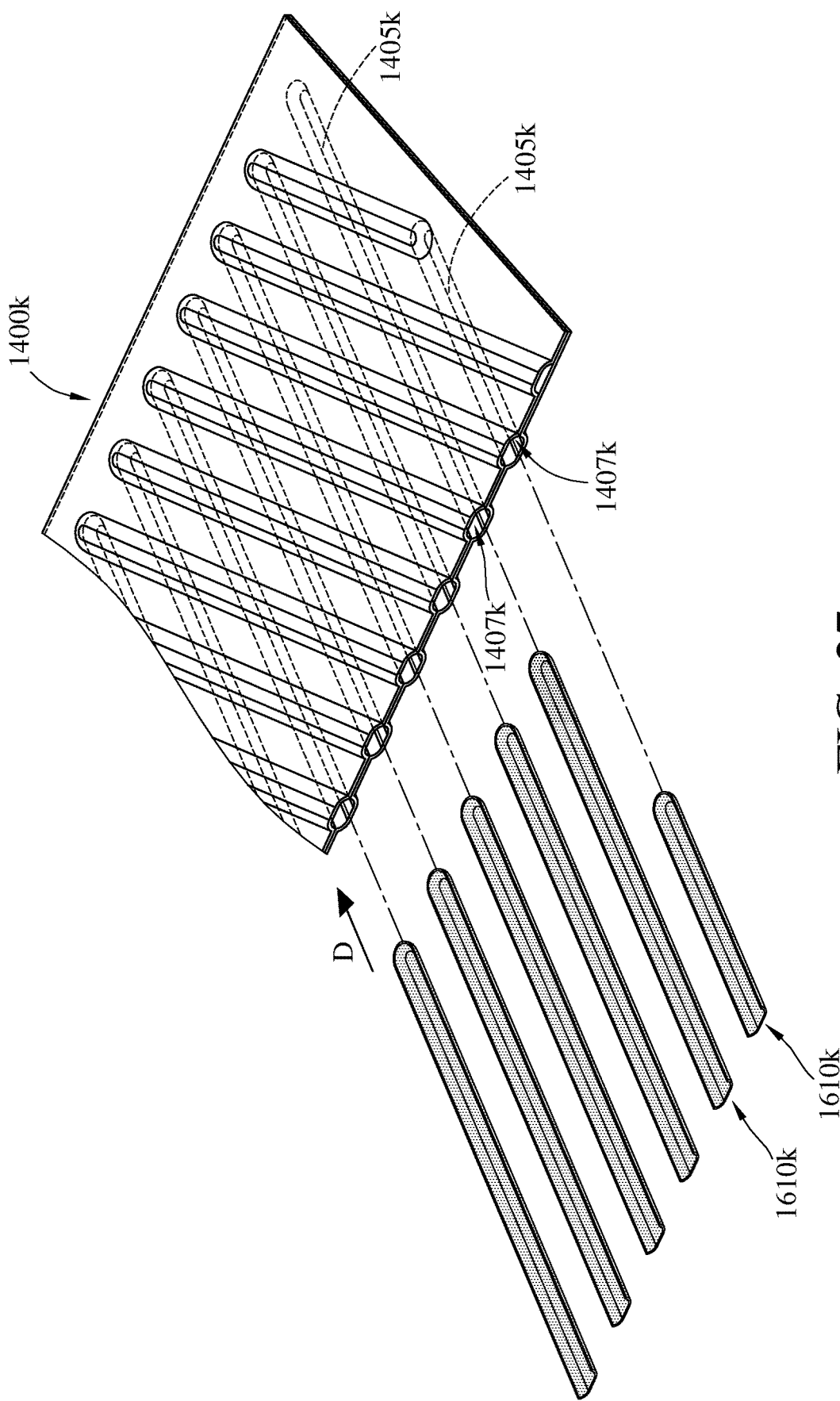
FIGS. 27, 28, and 29 are views showing a process of forming capillary structure in the roll-bonded heat exchanger in FIG. 26.
Figure 28:
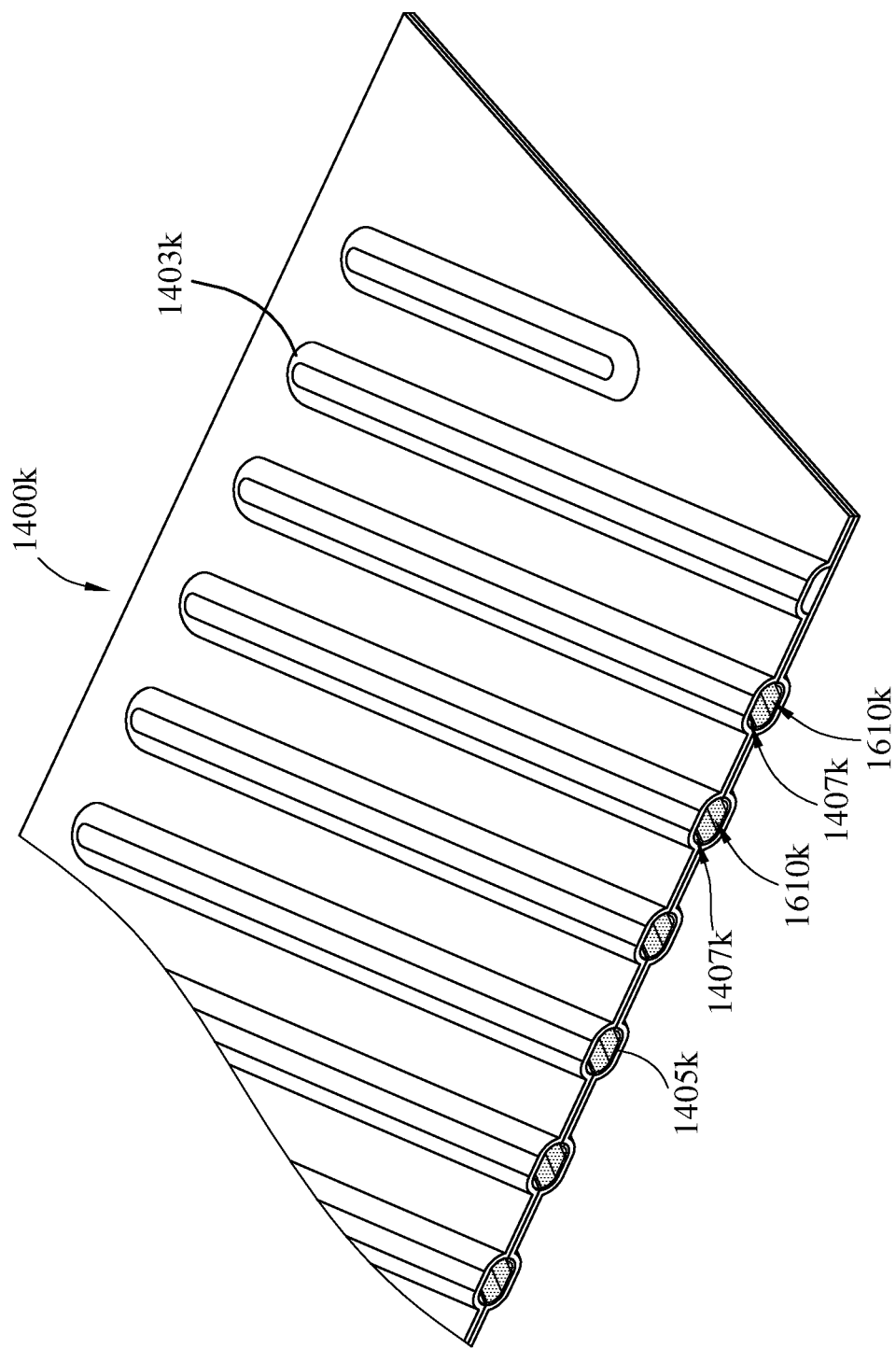
Figure 29:
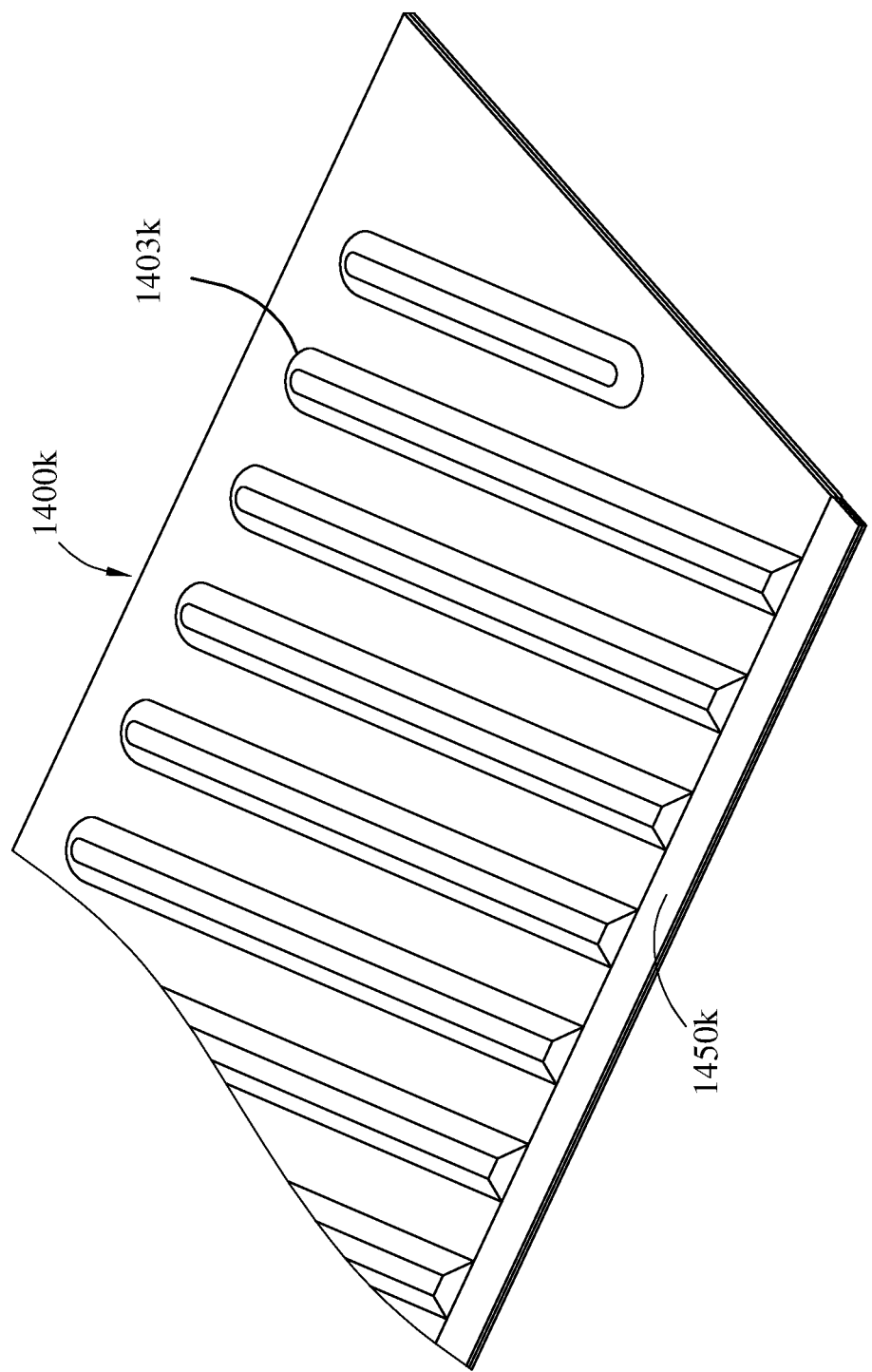

FIG. 26 is an isometric view of a roll-bonded heat exchanger 140k according to an exemplary embodiment. FIG. 27, FIG. 28, and FIG. 29 are views showing a process of forming a capillary structure of the roll-bonded heat exchanger 140k in FIG. 26. As illustrated, a roll-bonded heat exchanger 140k includes a heat conducting plate body 1400k having a plurality of angled channels 1405k formed as grooves (or recesses) in the bottom plate of the heat conducting plate body 1400k and a plurality of angled channels 1403k formed as grooves (or recesses) in the top plate of the heat conducting plate body 1400k that are orientated opposite angled channels 1405k. The angled channels 1403k and 1405k extend in a straight line (without any bends or curves) in the body of the roll-bonded heat exchanger 140k. Each angled channel 1405k includes a single capillary structure 1610k. It will be understood that the angled channels 1403k and 1405k are considered angled or inclined with reference to the top (or bottom) edge of the heat conducting plate body 1400k.

There are two methods for forming the capillary structures 1610k in the roll-bonded heat exchanger 140k. In a first method, the capillary structures 1610k are placed into the roll-bonded heat exchanger 140k prior to roll bonding the top and bottom plates of the roll-bonded heat exchanger 140k. The roll-bonded heat exchanger 140k may be similar in some aspects to the roll-bonded heat exchanger 140a and may include two plates (similar to the plates 1410a and 1420a) bonded to each other. In a second method, the capillary structures 1610k are placed in the channels 1405k after roll bonding the two plates forming the heat conducting plate body 1400k.

In the first method, the capillary structures 1610k are formed on the surfaces of plates that form the heat conducting plate body 1400k by, for example, disposing metal woven mesh on the surfaces of at least one of the plates facing each other. Specifically, the top and bottom plates of the roll-bonded heat exchanger 140k are stamped to form the channels 1403k and 1405k, respectively, and the metal woven mesh is disposed in one of the channels 1403k and 1405k. For the sake of discussion, the metal woven mesh is depicted as disposed in channel 1405k. The metal woven mesh forms the capillary structure of the heat conducting plate body 1400k. In one embodiment, the metal woven mesh is welded to the surface of the plates. Alternatively, the surfaces of the plates are chemically etched to create micro pores or micro structures for forming the capillary structure of the heat conducting plate body 1400k. In another embodiment, the surfaces of the plates are sandblasted to form the capillary structure of the heat conducting plate body 1400k.

Then, the top and bottom plates are contacted against each other and the edges of the plates are sealingly bonded to each other by, for example, a roll bonding process. A blow molding process is then performed to create the channels 1405k. Briefly, in the blow molding process, indentations are provided at predetermined locations on opposite surfaces of the top and bottom plates. After bonding the two plates together, gas is pumped into the opening 1406a. The pressure of the gas will thus blow up the channels 1405k along the paths defined by the indentations. The air in the roll-bonded heat exchanger 140k is removed and the opening 1406a is sealed by welding, for example.

In the second method, the heat conducting plate body 1400k is cut along the line B shown in FIG. 26, such that, the angled channels 1403k and 1405k are exposed (See FIG. 27) via openings 1407k. The capillary structures 1610k are respectively placed into the angled channels 1405k via the openings 1407k along a direction D. FIG. 28 illustrates the heat conducting plate body 1400k with the capillary structures 1610k placed in the angled channels 1405k. The angled channels 1405k are referred to as flow channels since liquid flows through the capillary structures 1610k in these channels. The angled channels 1403k are referred to as vapor channel since vapor that is generated after interaction with a heat generating source flows through these channels. As shown in FIG. 29, a roll bonding process is performed to seal the openings 1407k and create a flat structure 150k. The ends of the flat structure 150k are welded to seal the roll-bonded heat exchanger.

The capillary structures 1610k may be formed in the angled channels 1405k by three different methods. In a first method, copper braids or rolled-up metal meshes or copper cloths are introduced in the angled channel 1405k via the openings 1407k. In a second method (illustrated in FIG. 27), copper powder is sintered to obtain the capillary structures 1610k in shape of pillars and the pillars are placed in the inclined channels 1405k. In the third method, fixtures (e.g., stick-like structures) are inserted into the angled channels 1405k and then copper powder is poured in the space between the angled channels 1405k and the fixtures to fill the space. The roll-bonded heat exchanger 140k is subjected to vibrations so that the copper powder is more uniformly filled in the angled channels 1405k. The copper power is sintered to obtain the capillary structures 1610k.

Figure 30:
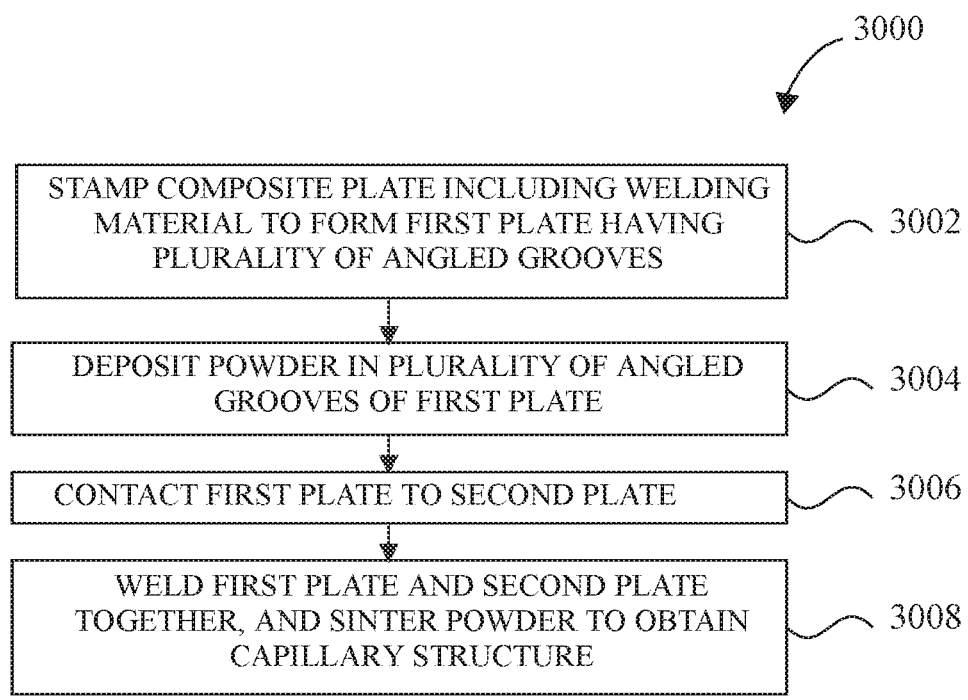
FIGS. 30, 31, 32, and 33 are flow charts of different methods for manufacturing a heat dissipation device.

FIG. 30 is a flow chart illustrating steps in a method 3000 for manufacturing a heat dissipation device, according to an example embodiment. In some embodiments, a method consistent with the present disclosure may include at least one of the steps illustrated for method 3000, performed in any order. For example, embodiments consistent with the present disclosure may include one or more steps in method 3000 performed in parallel, simultaneously, quasi-simultaneously, or overlapping in time.

Step 3002 includes stamping a composite plate including a welding material to form a first plate having a plurality of angled grooves. Step 3004 includes depositing powder in the plurality of angled grooves of the first plate. Step 3006 includes contacting the first plate to a second plate. Step 3008 includes welding the first plate and the second plate together, and sintering powder to obtain a capillary structure.

Figure 31:
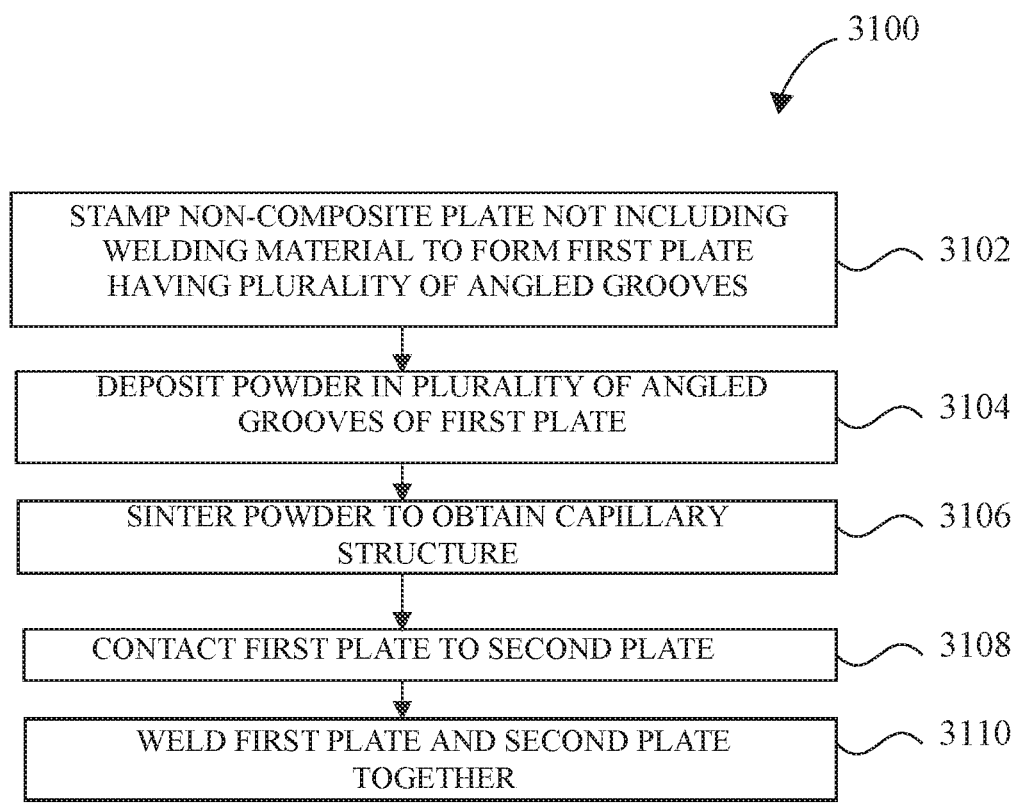

FIG. 31 is a flow chart illustrating steps in a method 3100 for manufacturing a heat dissipation device, according to an example embodiment. In some embodiments, a method consistent with the present disclosure may include at least one of the steps illustrated for method 3100, performed in any order. For example, embodiments consistent with the present disclosure may include one or more steps in method 3100 performed in parallel, simultaneously, quasi-simultaneously, or overlapping in time.

Step 3102 includes stamping a non-composite plate not including a welding material to form a first plate having a plurality of angled grooves. Step 3104 includes depositing powder in the plurality of angled grooves of the first plate. Step 3106 includes sintering the powder to obtain a capillary structure. Step 3108 includes contacting the first plate to a second plate. Step 3110 includes welding the first plate and the second plate together.

Figure 32:
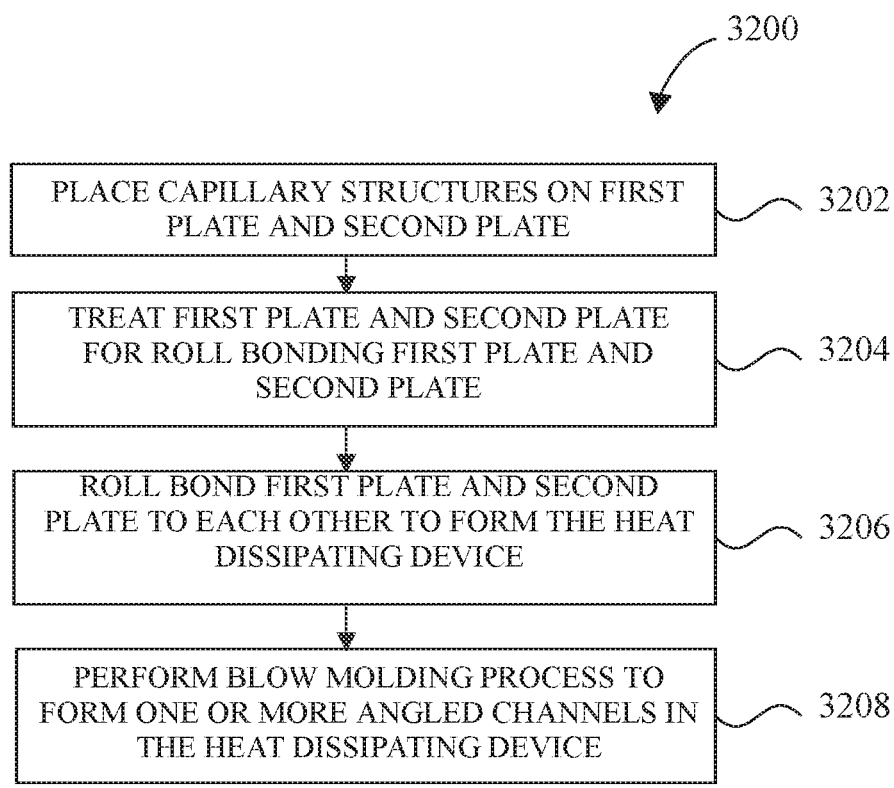

FIG. 32 is a flow chart illustrating steps in a method 3200 for manufacturing a heat dissipation device, according to an example embodiment. In some embodiments, a method consistent with the present disclosure may include at least one of the steps illustrated for method 3200, performed in any order. For example, embodiments consistent with the present disclosure may include one or more steps in method 3200 performed in parallel, simultaneously, quasi-simultaneously, or overlapping in time.

Step 3202 includes placing capillary structures on a first plate and a second plate. Step 3204 includes treating the first plate and the second plate for roll bonding the first plate and second plate. Step 3206 includes roll bonding the first plate and second plate to each other to obtain the heat dissipating device. Step 3208 includes performing a blow molding process to form one or more angled channels in the heat dissipating device.

Figure 33:
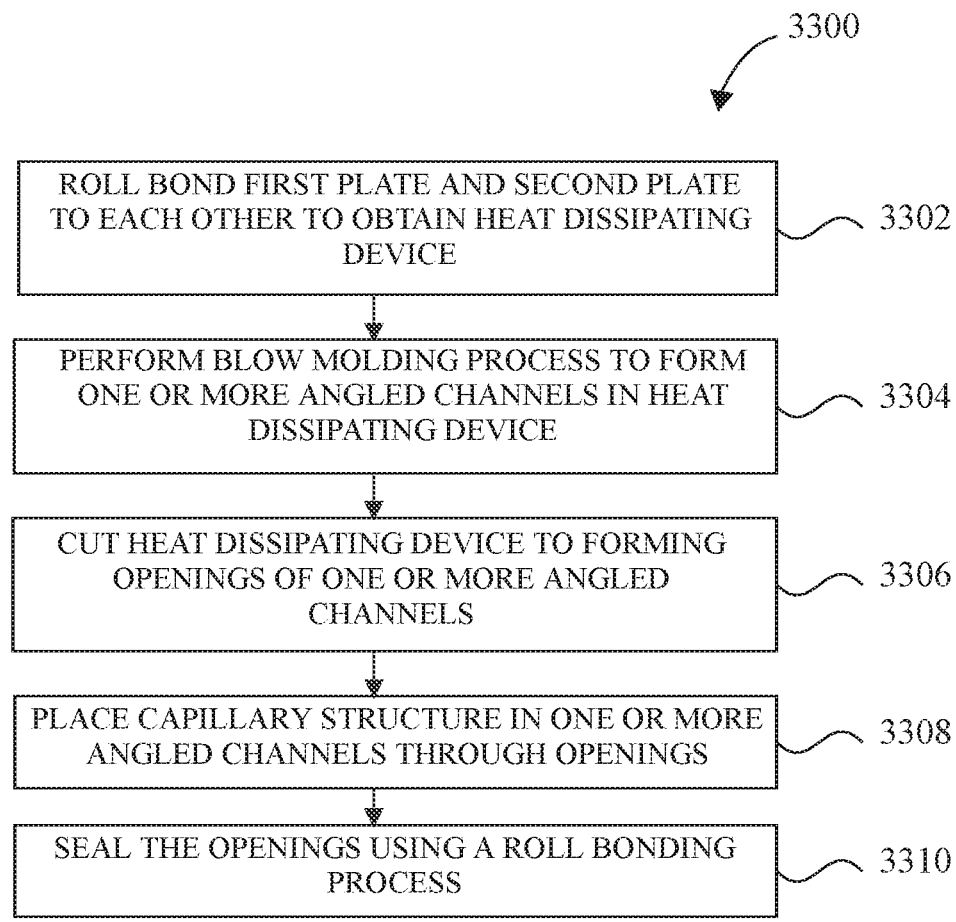

FIG. 33 is a flow chart illustrating steps in a method 3300 for manufacturing a heat dissipation device, according to an example embodiment. In some embodiments, a method consistent with the present disclosure may include at least one of the steps illustrated for method 3300, performed in any order. For example, embodiments consistent with the present disclosure may include one or more steps in method 3300 performed in parallel, simultaneously, quasi-simultaneously, or overlapping in time.

Step 3302 includes roll bonding a first plate and a second plate to each other to obtain the heat dissipating device. Step 3304 includes performing a blow molding process to form one or more angled channels in the heat dissipating device. Step 3306 cutting the heat dissipating device to forming openings of the one or more angled channels. Step 3308 includes placing a capillary structure in the one or more angled channels through the openings. Step 3310 includes sealing the openings using a roll bonding process.

The roll-bonded heat exchangers according to example embodiments discussed above, provide a guiding structure and a capillary structure to assist coolant to flow opposite to the force of gravity, so that the coolant in the cooling area located below the heat absorbing area is able to flow back to the heat absorbing area and thereby circulate in the roll-bonded heat exchanger. Therefore, the heat dissipation efficiency of the roll-bonded heat exchanger is improved. Compared to conventional vapor chambers, the heat dissipation efficiency of the vapor chamber according to example embodiments is increased by at least 30 percent.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a heat dissipation device, comprising:
    stamping a composite plate including a welding material to form a first plate having a plurality of angled grooves, wherein each angled groove extends continuously between opposite longitudinal edges of the first plate and each angled groove is inclined with reference to the longitudinal edges;
    depositing powder in the plurality of angled grooves of the first plate;
    contacting the first plate to a second plate; and
    welding the first plate and the second plate together, and sintering powder to obtain a capillary structure.

2. The method according to claim 1, further comprising providing a welding flux on the second plate before contacting the first plate to the second plate.

3. The method according to claim 1, further comprising introducing a coolant in the plurality of angled grooves after welding the first plate and the second plate.

* * * * *